(12) United States Patent
Amzaleg et al.

(10) Patent No.: US 9,070,180 B2
(45) Date of Patent: Jun. 30, 2015

(54) METHOD, SYSTEM, AND COMPUTER PROGRAM PRODUCT FOR DETECTION OF DEFECTS BASED ON MULTIPLE REFERENCES

(71) Applicant: Applied Materials Israel Ltd., Rehovot (IL)

(72) Inventors: Moshe Amzaleg, Beer Sheva (IL); Yehuda Cohen, Moshav Timorim (IL); Nir Ben-David Dodzin, Hod Hasharon (IL); Efrat Rozenman, Aseret (IL)

(73) Assignee: APPLIED MATERIALS ISRAEL, LTD., Rehovot (IL)

( * ) Notice: Subject to any disclaimer, the term of this patent is extended or adjusted under 35 U.S.C. 154(b) by 17 days.

(21) Appl. No.: 13/773,549

(22) Filed: Feb. 21, 2013

(65) Prior Publication Data
US 2014/0233838 A1 Aug. 21, 2014

(51) Int. Cl.
*G06K 9/00* (2006.01)
*G06T 7/00* (2006.01)
*H01L 21/67* (2006.01)

(52) U.S. Cl.
CPC ....... *G06T 7/001* (2013.01); *G06T 2207/30148* (2013.01); *H01L 21/67288* (2013.01)

(58) Field of Classification Search
USPC .............. 250/559.04; 324/718; 382/141, 149, 382/221; 702/35; 716/112
See application file for complete search history.

(56) References Cited

U.S. PATENT DOCUMENTS

| | | | |
|---|---|---|---|
| 2001/0033683 A1* | 10/2001 | Tanaka et al. | 382/149 |
| 2005/0002554 A1* | 1/2005 | Schulze et al. | 382/144 |
| 2006/0045333 A1* | 3/2006 | Wu et al. | 382/167 |
| 2008/0162061 A1* | 7/2008 | Miyano | 702/70 |

* cited by examiner

*Primary Examiner* — Gregory F Cunningham
(74) *Attorney, Agent, or Firm* — Lowenstein Sandler LLP

(57) ABSTRACT

A defect detection system for computerized detection of defects in an inspected object based on processing of an inspection image generated by collecting signals arriving from the inspected object, the system including: an interface for obtaining an inspected noise-indicative value and multiple reference noise-indicative values, the inspected noise-indicative value representative of an analyzed pixel and each of the reference noise-indicative values representative of a reference pixel among a plurality of reference pixels; and a processor, including: a noise analysis module, configured to compute a representative noise-indicative value based on a plurality of noise-indicative values which includes the inspected noise-indicative value and the multiple reference noise-indicative values; and a defect analysis module, configured to calculate a defect-indicative value based on an inspected value representative of the analyzed pixel, and to determine a presence of a defect in the analyzed pixel based on the representative noise-indicative value and the defect-indicative value.

20 Claims, 12 Drawing Sheets

METHOD, SYSTEM, AND COMPUTER PROGRAM PRODUCT FOR DETECTION OF DEFECTS BASED ON MULTIPLE REFERENCES

FIELD OF THE INVENTION

The invention relates to systems, methods, and computer program products for detection of defects in an inspected object based on processing of an inspection image generated by collecting signals arriving from the inspected object.

BACKGROUND OF THE INVENTION

Current demands for high density and performance associated with ultra large scale integration require submicron features, increased transistor and circuit speeds and improved reliability. Such demands require formation of device features with high precision and uniformity, which in turn necessitate careful process monitoring, including frequent and detailed inspection of the devices while they are still in the form of semiconductor wafers.

A conventional in-process monitoring technique employs a two phase "inspection and review" procedure. During the first phase, the surface of the wafer is inspected at high-speed and relatively low-resolution. The purpose of the first phase is to produce a defect map showing suspected locations on the wafer having a high probability of a defect. During the second phase the suspected locations are more thoroughly analyzed. Both phases may be implemented by the same device, but this is not necessary.

The two phase inspection tool may have a single detector or multiple detectors. Multiple detector two phase inspection devices are described, by way of example, in U.S. Pat. Nos. 5,699,447, 5,982,921, and 6,178,257.

FIG. 1 is an illustration of a wafer 10 such as ones which may be used in the fabrication of integrated circuits and other microdevices. While the term wafer may be used to refer only to the substrate material on which the integrated circuit is fabricated (e.g. a thin slice of semiconductor material, such as a silicon crystal), this term may also be used to refer to the entire construction, including the electronic circuit fabricated on the wafer.

The wafer 10 is divided into multiple dies 11 which are illustrated in a widely implemented rectangular form. Like the term 'wafer', the term 'die' may also be used either for small blocks of semiconducting material, on which a given functional circuit is fabricated, or for such a block including the fabricated electric circuit. Usually, wafer 10 may be cut ("diced") into its multiple dies 11, wherein all of the dies of the wafer contain a copy of the same electronic circuit. While not necessarily so, each of the dies 11 is independently functional.

A single die may include a large amount of patterns that well exceed millions of patterns per die. A semiconductor die usually includes a plurality of layers. A pattern, such as local pattern 24 may be a part of a metal interconnection line, a trench, a via, a conductive gate, etc. Different areas on each die may be put to different uses; such areas may be for example background areas (that are ideally very smooth), memory areas (that include a large number of repetitive patterns) and logic areas (that usually do not include large quantities of adjacent repetitive patterns).

FIG. 2 illustrates a portion of an inspection image of an electric circuit (which may be manufactured on a wafer) which is repetitive in nature. While not necessarily so, portion 12 illustrated in FIG. 2 may represent a part of a single die 11. It is noted that the inspection image to which the herein disclosed systems and methods pertain may be any inspection image that is generated by collecting signals arriving from the inspected object (e.g. electromagnetic signals, reflected images, etc.).

Portion 12 shows 20 cells (a singled out cell is denoted 13 in the drawing and is framed with a broken-line) which are arranged in a 4 by 5 array, wherein the content of the cells are similar to each other. Each of the small squares within each cell (whether black or white) represents a single pixel. The bold lines surrounding each cell (whose size is 8×8 pixels) are presented for the sake of illustration only.

In the illustration of FIG. 2, the image is a binary image in which each pixels may have one out of two possible values (represented by black and white pixels). However, in other implementations (e.g. as in many machines used for wafer inspection and mask inspection), richer color depth may be used (e.g. 256 possible values for each pixel).

While the cells of FIG. 2 are identical to each other, it is clear that in a real life scan image of an actual object, e.g. wafer, the cells may be somewhat different from each other. Some of these differences are not indicative of defects (e.g. scanning errors, illumination defects, or even manufacture inaccuracies which do not mount to a defect nor do they render the electric circuit faulty), while other differences may be indicative of an actual defect which is to be detected.

Prior art Cell-to-Cell comparison techniques include the comparing of a pixel of one cell to a corresponding pixel of one other cell (e.g. an adjacent one), and based on the difference between these two values, determining whether there is a possible defect in that pixel or not.

There exists a need for improved and more robust techniques for detecting defects in a substrate, and especially in a semiconductor substrate.

SUMMARY OF THE INVENTION

In accordance with an aspect of the presently disclosed subject matter, there is provided a defect detection system for computerized detection of defects in an inspected object based on processing of an inspection image generated by collecting signals arriving from the inspected object, the system including:
- an interface for obtaining an inspected noise-indicative value and multiple reference noise-indicative values, the inspected noise-indicative value representative of an analyzed pixel and each of the reference noise-indicative values representative of a reference pixel among a plurality of reference pixels; and
- a processor, including: (a) a noise analysis module, configured to compute a representative noise-indicative value based on a plurality of noise-indicative values which includes the inspected noise-indicative value and the multiple reference noise-indicative values; and (b) a defect analysis module, configured to calculate a defect-indicative value based on an inspected value representative of the analyzed pixel, and to determine a presence of a defect in the analyzed pixel based on the representative noise-indicative value and the defect-indicative value.

In accordance with an embodiment of the presently disclosed subject matter, there is provided a system, wherein the inspected object is selected from a group consisting of an electronic circuit, a wafer, a photomask, and a reticle.

In accordance with an embodiment of the presently disclosed subject matter, there is provided a system, wherein the plurality of reference pixels are selected based on a selection rule which is based on at least one of: (a) in-die periodicity and (b) design data used for the manufacturing of the inspected object.

In accordance with an embodiment of the presently disclosed subject matter, there is further provided a system, wherein the noise analysis module is configured to compute the representative noise value at least by: (a) selecting a proper subset of the plurality of noise-indicative values which are representative of corresponding pixels of a group including the analyzed pixels and the plurality of reference pixels, the subset excluding a minimal noise-indicative value out of the plurality of noise-indicative values; and (b) defining the representative noise-indicative value based on the proper subset of noise-indicative values.

In accordance with an embodiment of the presently disclosed subject matter, there is yet further provided a system, wherein the noise analysis module is configured to select the proper subset according to a selection rule which is defined based on characteristics of the inspection and on requirements of the defect detection system.

In accordance with an embodiment of the presently disclosed subject matter, there is further provided a system, wherein the noise analysis module is configured to select the proper subset based on a size order between the plurality of noise indicative values.

In accordance with an embodiment of the presently disclosed subject matter, there is provided a system, wherein the noise analysis module is configured to compute the representative noise-indicative value based on the proper subset which excludes a maximal noise-indicative value out of the plurality of noise-indicative values.

In accordance with an embodiment of the presently disclosed subject matter, there is yet further provided a system, wherein the noise analysis module is configured to compute the representative noise-indicative value based on the proper subset that consists only of the second noisiest noise-indicative value of the plurality of noise-indicative values.

In accordance with an embodiment of the presently disclosed subject matter, there is yet further provided a system, wherein the noise analysis module is configured to compute the representative noise-indicative value by selecting one of the plurality of noise-indicative values as the representative noise-indicative value.

In accordance with an embodiment of the presently disclosed subject matter, there is yet further provided a system, wherein the processor is configured to select the plurality of reference pixels out of at least one inspection image, based on reference cells predefined in the at least one image.

In accordance with an aspect of the presently disclosed subject matter, there is yet further provided a method for computerized detection of defects in an inspected object based on processing of an inspection image generated by collecting signals arriving from the inspected object, the method including: (a) obtaining an inspected noise-indicative value and multiple reference noise-indicative values, the inspected noise-indicative value representative of an analyzed pixel and each of the reference noise-indicative values representative of a reference pixel among a plurality of reference pixels; (b) computing a representative noise-indicative value based on a plurality of noise-indicative values which includes the noise-indicative value and the multiple reference noise-indicative values; (c) calculating a defect-indicative value based on an inspected value representative of the analyzed pixel; and (d) determining a presence of a defect in the analyzed pixel based on the representative noise-indicative value and the defect-indicative value.

In accordance with an embodiment of the presently disclosed subject matter, each of the analyzed pixel and the multiple reference pixels is a pixel of an inspected image of the inspected object.

In accordance with an embodiment of the presently disclosed subject matter, there is yet further provided a method, wherein the inspected object is selected from a group consisting of an electronic circuit, a wafer, a photomask, and a reticle.

In accordance with an embodiment of the presently disclosed subject matter, there is yet further provided a method, wherein the computing includes: (a) selecting a proper subset of the plurality of noise-indicative values which are representative of corresponding pixels of a group including the analyzed pixels and the plurality of reference pixels, the subset excluding a minimal noise-indicative value out of the plurality of noise-indicative values; and (b) defining the representative noise-indicative value based on the proper subset of noise-indicative values.

In accordance with an embodiment of the presently disclosed subject matter, there is yet further provided a method, wherein the selecting includes selecting the proper subset based on a size order between the plurality of noise indicative values.

In accordance with an embodiment of the presently disclosed subject matter, there is yet further provided a method, wherein the computing is based on the proper subset which excludes a maximal noise-indicative value out of the plurality of noise-indicative values.

In accordance with an embodiment of the presently disclosed subject matter, there is yet further provided a method, wherein the computing is based on the proper subset that consists only of the second noisiest noise-indicative value of the plurality of noise-indicative values.

In accordance with an embodiment of the presently disclosed subject matter, there is yet further provided a method, wherein the computing includes selecting one of the plurality of noise-indicative values as the representative noise-indicative value.

In accordance with an embodiment of the presently disclosed subject matter, there is yet further provided a method, further including selecting the plurality of reference pixels out of at least one inspection image, based on reference cells predefined in the at least one image.

In accordance with an aspect of the presently disclosed subject matter, there is yet further provided a program storage device readable by machine, tangibly embodying a program of instructions executable by the machine to perform method for computerized detection of defects in an inspected object based on processing of an inspection image generated by collecting signals arriving from the inspected object, including the steps of: (a) obtaining an inspected noise-indicative value and multiple reference noise-indicative values, the inspected noise-indicative value representative of an analyzed pixel and each of the reference noise-indicative values representative of a reference pixel among a plurality of reference pixels; (b) computing a representative noise-indicative value based on a plurality of noise-indicative values which includes the noise-indicative value and the multiple reference noise-indicative values; (c) calculating a defect-indicative value based on an inspected value representative of the analyzed pixel; and (d) determining a presence of a defect in the analyzed pixel based on the representative noise-indicative value and the defect-indicative value.

In accordance with an embodiment of the presently disclosed subject matter, there is yet further provided a program storage device, wherein the inspected object is selected from a group consisting of an electronic circuit, a wafer, a photomask, and a reticle.

In accordance with an embodiment of the presently disclosed subject matter, there is yet further provided a program storage device, wherein the computing includes: (a) selecting a proper subset of the plurality of noise-indicative values which are representative of corresponding pixels of a group including the analyzed pixels and the plurality of reference pixels, the subset excluding a minimal noise-indicative value out of the plurality of noise-indicative values; and (b) defining the representative noise-indicative value based on the proper subset of noise-indicative values.

In accordance with an embodiment of the presently disclosed subject matter, there is yet further provided a program storage device, wherein the selecting includes selecting the proper subset based on a size order between the plurality of noise indicative values.

In accordance with an embodiment of the presently disclosed subject matter, there is yet further provided a program storage device, wherein the computing is based on the proper subset which excludes a maximal noise-indicative value out of the plurality of noise-indicative values.

In accordance with an embodiment of the presently disclosed subject matter, there is yet further provided a program storage device, wherein the computing is based on the proper subset that consists only of the second noisiest noise-indicative value of the plurality of noise-indicative values.

In accordance with an embodiment of the presently disclosed subject matter, there is yet further provided a program storage device, wherein the computing includes selecting one of the plurality of noise-indicative values as the representative noise-indicative value.

In accordance with an embodiment of the presently disclosed subject matter, there is yet further provided a program storage device, wherein the program of instructions further including instructions for selecting the plurality of reference pixels out of at least one inspection image, based on reference cells predefined in the at least one image.

BRIEF DESCRIPTION OF THE DRAWINGS

In order to understand the desires and to see how it may be carried out in practice, embodiments will now be described, by way of non-limiting example only, with reference to the accompanying drawings, in which.

Figure 1:
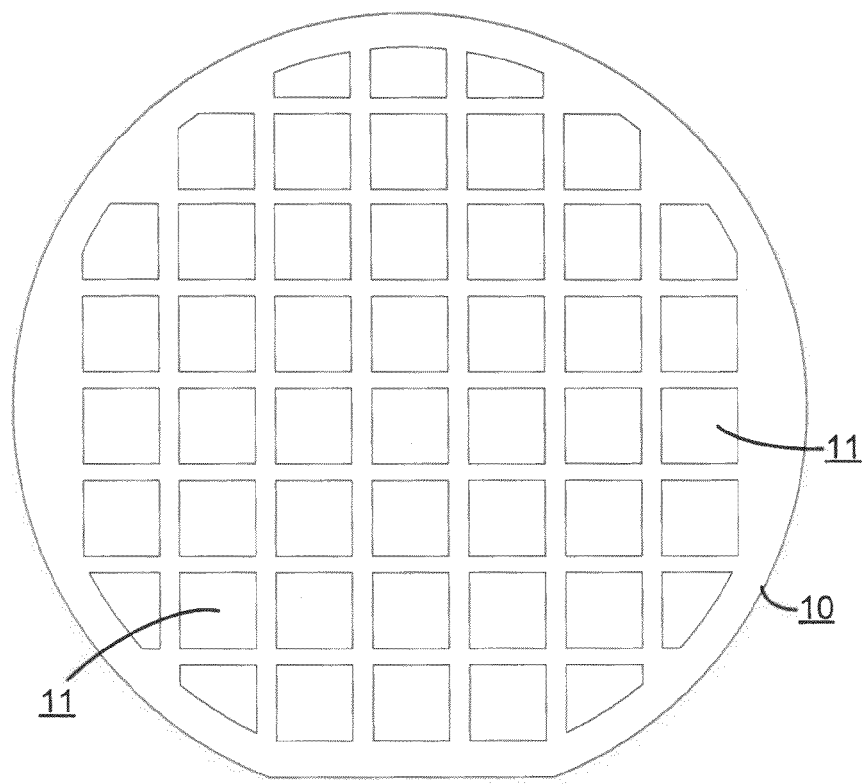
FIG. 1 is an illustration of a wafer such as ones which may be used in the fabrication of integrated circuits and other microdevices.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

In the drawings and descriptions set forth, identical reference numerals indicate those components that are common to different embodiments or configurations.

Unless specifically stated otherwise, as apparent from the following discussions, it is appreciated that throughout the specification discussions utilizing terms such as "processing", "calculating", "determining", "generating", "setting", "configuring", "selecting", "defining", "computing" or the like, include action and/or processes of a computer that manipulate and/or transform data into other data, said data represented as physical quantities, e.g. such as electronic quantities, and/or said data representing the physical objects. The terms "computer", "processor", "processing module" and the like should be expansively construed to cover any kind of electronic device with data processing capabilities, including, by way of non-limiting example, a personal computer, a server, a computing system, a communication device, a processor (e.g. digital signal processor (DSP), a microcontroller, a field programmable gate array (FPGA), an application specific integrated circuit (ASIC), etc.), any other electronic computing device, and or any combination thereof.

The operations in accordance with the teachings herein may be performed by a computer specially constructed for the desired purposes or by a general purpose computer specially configured for the desired purpose by a computer program stored in a computer readable storage medium.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment(s) is included in at least one embodiment of the presently disclosed subject matter. Thus the appearance of the phrase "one case", "some cases", "other cases" or variants thereof does not necessarily refer to the same embodiment(s).

It is appreciated that certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable sub-combination.

In embodiments of the presently disclosed subject matter one or more stages illustrated in the figures may be executed in a different order and/or one or more groups of stages may be executed simultaneously and vice versa. The figures illustrate a general schematic of the system architecture in accordance with an embodiment of the presently disclosed subject matter. Each module in the figures can be made up of any combination of software, hardware and/or firmware that performs the functions as defined and explained herein. The modules in the figures may be centralized in one location or dispersed over more than one location.

Figure 3:
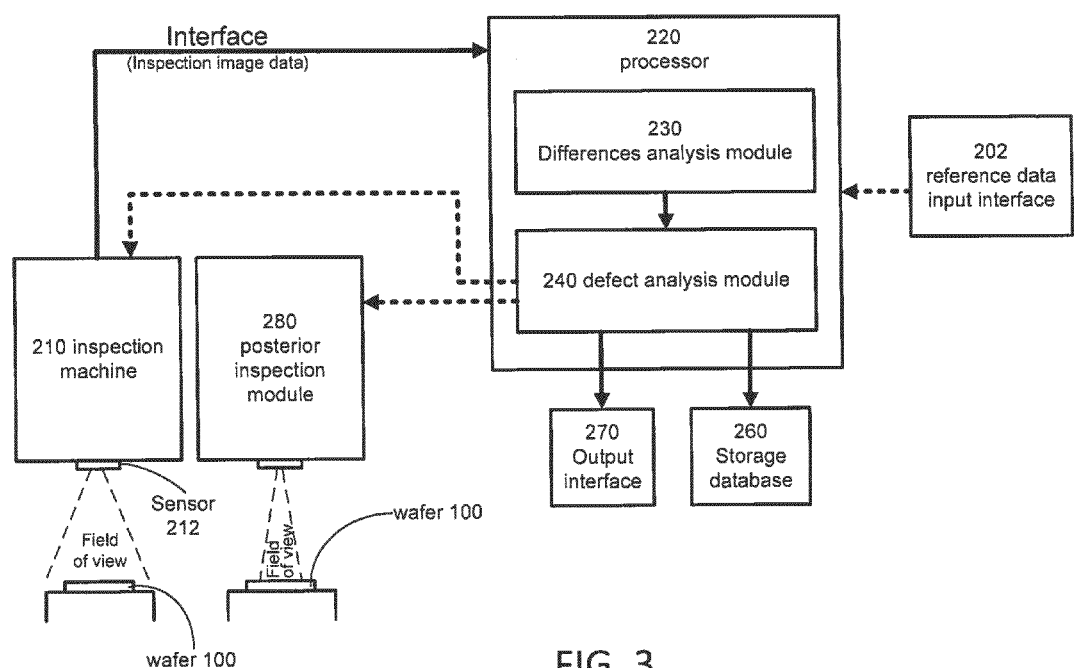
FIG. 3 is a block diagram of a defect detection system, according to an embodiment of the invention.

FIG. 3 is a block diagram of defect detection system 200, according to an embodiment of the invention. System 200 may be used for detection of defects (or other types of identified items) within an inspection image of an inspected object (herein exemplified by wafer 100. As will be clear to a person who is of skill in the art, later references to a "wafer" may be implemented for other types of inspected object, mutatis mutandis). While not necessarily so, the inspected object may be selected from a group consisting of an electronic circuit, a wafer, and a photomask. It should be noted that, as will be clear to any person who is of skill in the art, wherever the term "wafer" is used—similar techniques, systems, methods and computer program products may be implemented for optical masks that are used for the manufacturing of wafers.

System 200 may obtain the inspection image in many ways. For example, system 200 may be combined with an inspection machine 210 that is used to inspect the wafer (e.g. during different stages of manufacturing thereof). In another implementation system 200 may be connected to such an inspection machine, or the inspection image may be transmitted by an off-line device connected to only one of the machines at a time. Also, system 200 may be an inspection machine into which some or all of the modifications and/or features discussed below have been integrated. For example, system 200 may include sensor 212 that is configured to inspect at least a part of the inspection object, to provide the inspection image.

The operation of system 200 and of the various components thereof may be better understood in view of the process of operation. Therefore, part of the description of system 200 will be provided after method 500 is discussed, and the description of system 200 preceding the discussion of method 500 is therefore partial.

While not necessarily so, the process of operation of system 200 may correspond to some or all of the stages of method 500. Likewise, method 500 and its possible implementations may be implemented by a system such as system 200. It is therefore noted that embodiments of the invention discussed in relation to method 500 may also be implemented, mutatis mutandis, in a hardware counterpart as various embodiments of system 200, and vice versa.

Without limiting the scope of the invention in any way, in some possible implementations system 200 may be used for inspection tools in which an entire wafer or at least an entire die is scanned for detection of potential defects (such as the Elite and the UVision systems by Applied Materials, Inc.), and/or for review tools which are typically of higher resolution (e.g. a scanning electron microscope, SEM) which are used for ascertaining whether a potential defect is indeed a defect. Such review tools usually inspect fragments of a die, one at a time, in high resolution. Whenever the term "inspection" or its derivatives are used in this disclosure, such an inspection is not limited with respect to resolution or size of inspection area, and may be applied, by way of example, to review tools and to lower resolution wafer inspection tools alike.

System 200 may include an interface for receiving inspection image data including information of an analyzed pixel and of a plurality of reference pixels. Examples of ways in which the interface may operate are discussed in further detail in relation to stage 510 of method 500. It is noted that the interface may receive the inspection image data from a component of system 200, or from an external system. The reference pixel may be obtained, for example, from a previous inspection of another die, either from the same wafer or not. It is noted that some of the data (e.g. pertaining to the reference pixels) may be received from systems other than the inspection system 210. For example, reference data pertaining to the reference pixels may be received from a reference data input interface 202 (which may be a part of the aforementioned interface, but not necessarily so). Interface 202 may be connected, for example, to a tangible storage medium which stores previous inspection information (either processed or preprocessed).

It is noted that the term "pixel" is very well known in the art and should be construed in a non-limiting way as including (though not necessarily limited to) an element of an image which has a color value (e.g. a gray level value), and a defined location within the image (e.g. integer x and y coordinates). The location of the pixel with respect to the image of which it is a part is relative to a location of the article imaged in the respective image.

The term "defect" is also very well known in the art, and should be construed in a non-limiting way as including (though not necessarily limited to) an undesirable local change that may kill the chip or affect its reliability. In this application, the term "defect" is sometimes used to denote a potentially defective pixel—a pixel or a location in a die which is suspected as containing a defect and for which, a decision on the presence of a defect is yet to be made. The term "defect" is sometimes used to denote a pixel or a location in a die for which a decision on the presence of a defect was made.

The plurality of reference pixels may be selected based on a selection rule which is based on (a) in-die periodicity (which may be detected, for example, by processing the inspection image), on (b) design data used for the manufacturing of the inspected object (e.g. CAD data, etc.), (c) on both, and/or on other factors.

System 200 further includes processor 220. While processor 220 may implement software and/or firmware component for its operation, it includes hardware components which enable it to perform the computations and processes for which it is implemented. While not necessarily so, processor 220 may be a dedicated processor whose hardware is designed specifically for the tasks discussed below.

Processor 220 includes several modules (at least modules 230 and 240), which may be independent modules, or implemented in an interconnected manner.

Differences analysis module 230 is configured to calculate differences based on an inspected value representative of the analyzed pixel and on multiple reference values, each of which is representative of a reference pixel among the plurality of reference pixels. Differences analysis module 230 is configured to calculate for each of the reference pixels a difference between the reference value of the reference pixel and the inspected value. Difference analysis module 230 is further configured to compute a representative difference value based on a plurality of the differences. Examples of ways in which differences analysis module 230 may operate are discussed in further detail in relation to stages 520 and 530 of method 500. It is noted that, according to embodiments of the invention, the reference value are also inspected values, in the sense that they are obtained from an inspection of the article. However, in order to simplify the textual differentiation when referring to the inspected value representative of the analyzed pixel to the ones representative of the reference pixel, the term "reference value" is used for the latter.

The inspected value (and likewise the reference values, in the following discussion) may be simply a color-value of the respective pixel, or a color-based attribute which is based on the color-value, but this is not necessarily so. In a gray-level (GL) image, the inspected value may be the one-dimensional color value of the respective pixel. In a color image, the inspected value may be a one-dimensional color value in one out of multiple color channels (e.g. Red, Green, or Blue, in an RGB image), an intensity value, a color identifier, and so on. That is, optionally the inspected value and the multiple reference values are gray-level values.

While in some implementations the inspected value may be representative of other pixels apart from the analyzed pixel (e.g. an average of the color of the analyzed pixels and of its 8 immediately adjacent pixels), in other implementations the inspected value is representative only of the analyzed pixel and is irrespective of information of other pixels (such as neighboring pixels).

Processor 220 further includes defect analysis module 240, which is configured to determine a presence of a defect in the analyzed pixel based on the representative difference value. Examples of ways in which defect analysis module 240 may operate are discussed below, and in yet further detail in relation to stage 550 of method 500.

System 200 may include a tangible storage 260 (e.g. a hard-drive disk, a flash drive, etc.) for storing results of the defect detection process (or part thereof—e.g. only regarding defects which are classified as noteworthy) to a tangible storage. System 200 may also include an output interface 270 for transmitting the results (or part thereof) to an external system (e.g. over cable connection or over wireless connection), wherein that external system may in turn act based on the classification.

System 200 may also include an inspection module, which may be the aforementioned inspection machine 210 which provides the aforementioned inspection image by scanning of the inspected objects such as the wafers, and may alternatively be posterior inspection module 280 that is configured to inspect the wafer (or other inspected object) in higher resolution than that of the inspection image. This inspection module is configured to selectively scan, in a resolution higher than the resolution of the inspection image, areas of the inspected object which are selected based on the locations of identified items (e.g. potential defects) which are classified into certain classes but not into at least one of the other classes (i.e. refraining from selecting potential defects classified into at least one class other than the certain classes). The field of view of posterior inspection module 280 may be narrower than that of inspection machine 210, but this is not necessarily so.

In such a case, the areas selected for further scanning may be selected based on the locations of potential defects which are classified into certain classes but not into at least one of the other classes. For example, the scanning in the higher resolution may be carried out around the locations of the possible defects classified as "short gate", but not around the locations of the possible defects classified as "edge roughness".

It should be noted that inspection machine 210 and/or posterior inspection module 280, if implemented, may be implemented as inspection machines of various types, such as optical imaging machines, electron beam inspection machines, radars, LIDARs and so on.

Generally, identifying defects in a wafer (or in another inspected object) may be implemented using different techniques, among which are optical inspection and electron beam inspection. Utilization of system 200 may facilitate the use of more than a single inspection technique. For example, an initial inspection of the wafer is firstly carried out relatively quickly and in a coarse manner by inspection system 200 (e.g. using an optical inspection or an electron beam inspection set for coarse and fast inspection). Later, some of the potential defects found in the initial inspection are then studied again using a relatively slower but more exact inspection. Such posterior scanning may be executed either in another mode of inspection machine 210, or in a different posterior inspection module 280 (in a process also referred to as "reviewing", e.g. by DRSEM—Defect Review Scanning Electron Microscope).

As aforementioned, some of the ways in which system 200 and its component may operate are discussed in greater detail with respect to method 500.

System 200 may be implemented on a computer (such as a PC), e.g. the computer which implements the overall classification (Image Based Attributing, IBA) of the runtime inspection results, but this is not necessarily so. Each of the modules or components of system 200 may be implemented in software, hardware, firmware, or any combination thereof. Additionally, system 200 may also include other components that are not illustrated, and whose inclusion will be apparent to a person who is of skill in the art—e.g. a power source, a display, etc.

Figure 4:
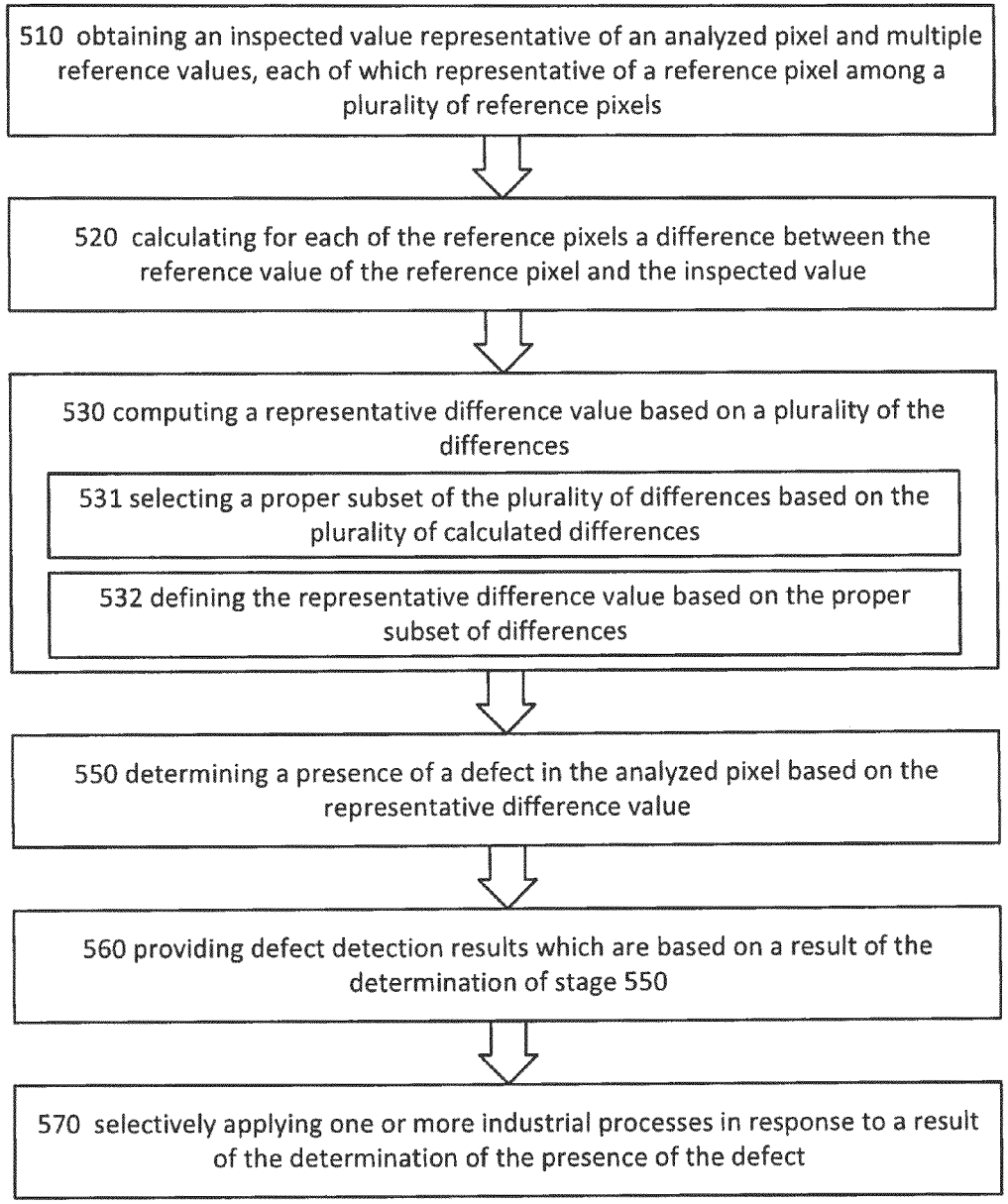
FIG. 4 is a flow chart of a computerized method for computerized detection of defects in an inspected object, according to an embodiment of the invention.

FIG. 4 is a flow chart of computerized method 500 for computerized detection of defects in an inspected object, according to an embodiment of the invention. Referring to the examples set forth in the previous drawings, method 500 may be carried out by system 200. Different embodiments of system 200 may implement the various disclosed variations of method 500 even if not explicitly elaborated. Likewise, different embodiments of method 500 may include stages whose execution fulfills the various disclosed variations of system 200, even if succinctness and clarity of description did not necessitate such repetition.

Method 500 may be implemented for various types of inspected objects, from a very minute scale (e.g. millimetric or nanoscale objects) to larger objects such as a geographical area imaged from an airplane or from a satellite.

In order to clarify the disclosure, different stages of method 500 will be exemplified using an example of an inspected object which is selected from a group consisting of an electronic circuit, a wafer, and a photomask (a partially transparent plate which may be used for the manufacturing of electronic circuits or other objects in a process implementing transmitting light through such a photomask, such as photolithography).

It is noted that while method 500 is described as a method for detecting defects (or at least potential defects) in the inspection object, a person who is of ordinary skill in the art would understand that method 500 may equivalently be implemented for detection of many other types of items within various types of inspection images. For example, apart from deviations from an expected pattern (such as a hole in a textile fabric, or a potential manufacturing defect in a wafer), other kinds of items which may be identified are specific items or a group thereof (e.g. looking for tanks in aerial images or for intruders in security camera data).

Stage 510 of method 500 includes obtaining an inspected value and multiple reference values. Referring to the examples set forth with respect to the previous drawings, stage 510 may be carried out by an inspection result interface such as inspection results the interface of system 200.

The inspected value is representative of an analyzed pixel and each of the multiple reference values is representative of a reference pixel among a plurality of reference pixels. The analyzed pixel is a pixel of an inspection image in which at least a part of the inspected object is imaged (e.g. an inspection image of a wafer). The reference pixels may be pixels of the same inspection image, and may also be pixels of other images (e.g. an inspection image of another area of the inspected object or an inspection image of a reference object similar to the inspected object), or of a model.

The inspected value (and likewise the reference values, in the following discussion) may be simply a color-value of the respective pixel, or a color-based attribute which is based on the color-value, but this is not necessarily so. In a gray-level (GL) image, the inspected value may be the one-dimensional color value of the respective pixel. In a color image, the inspected value may be a one-dimensional color value in one out of multiple color channels (e.g. Red, Green, or Blue, in an RGB image), an intensity value, a color identifier, and so on.

While in some implementations the inspected value may be representative of other pixels apart from the analyzed pixel (e.g. an average of the color of the analyzed pixels and of its 8 immediately adjacent pixels), in other implementations the inspected value is representative only of the analyzed pixel and is irrespective of information of other pixels (such as neighboring pixels).

It is noted that the obtaining of stage 510 may be implemented in different ways in different implementations of the invention. For example, the obtaining may include obtaining only information of the analyzed pixel and the reference pixels, but may also include obtaining information of images to which those pixels belong.

Figure 6:
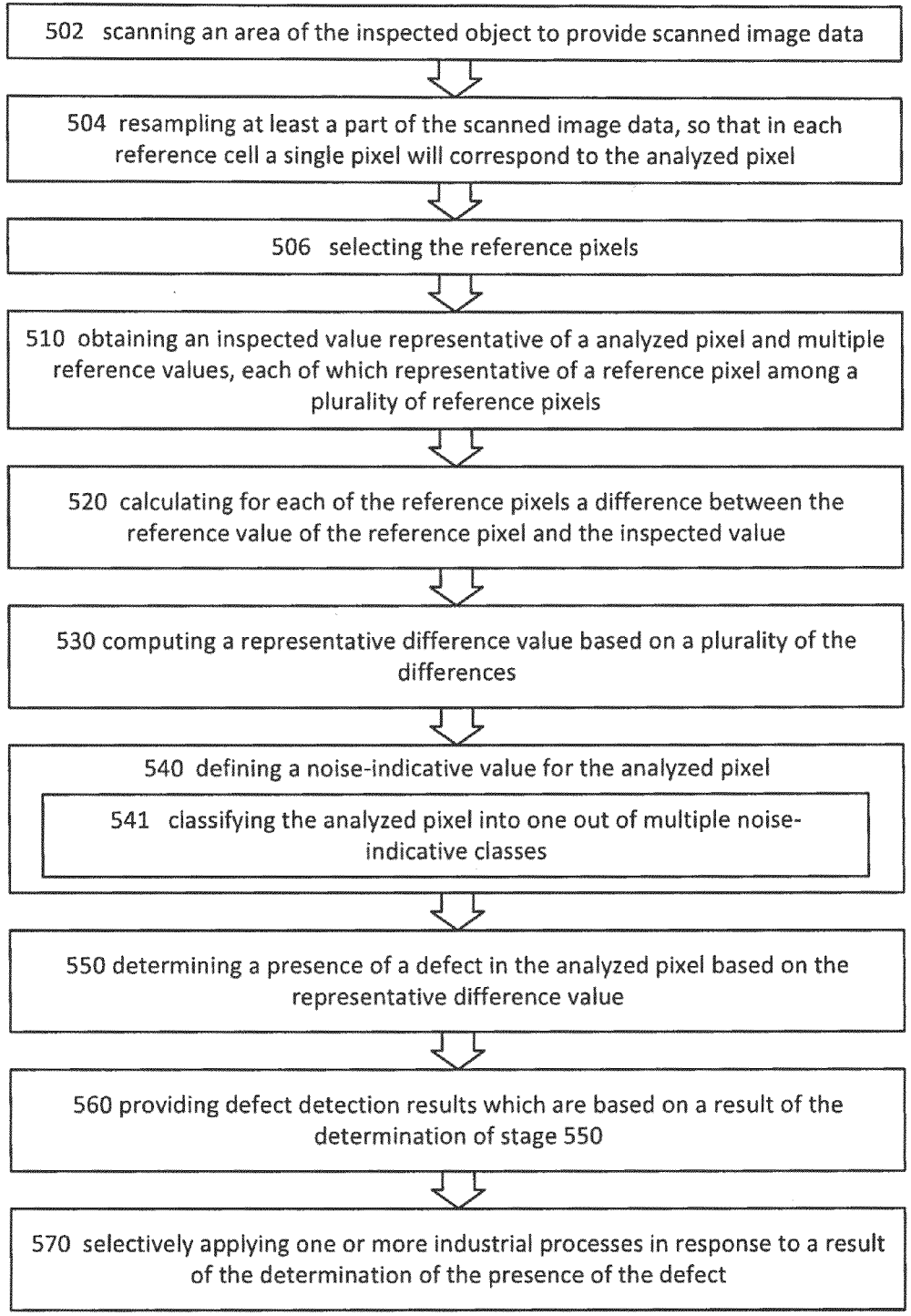
FIG. 6 is a flow chart of a computerized method for computerized detection of defects in an inspected object, according to an embodiment of the invention.

Furthermore, the obtaining may include obtaining such information from an external system (e.g. from an external inspection unit, external camera or detector, and so on), and/or obtaining such information by capturing (or otherwise generating) the aforementioned pixel information, or the larger part of the inspection image. Method 500 may include a stage of capturing the image information (e.g. as part of a scanning of the inspected object). Various possible implementations of the capturing of the pixel information are discussed with respect to optional stage 502, which is illustrated in FIG. 6.

Figure 2:
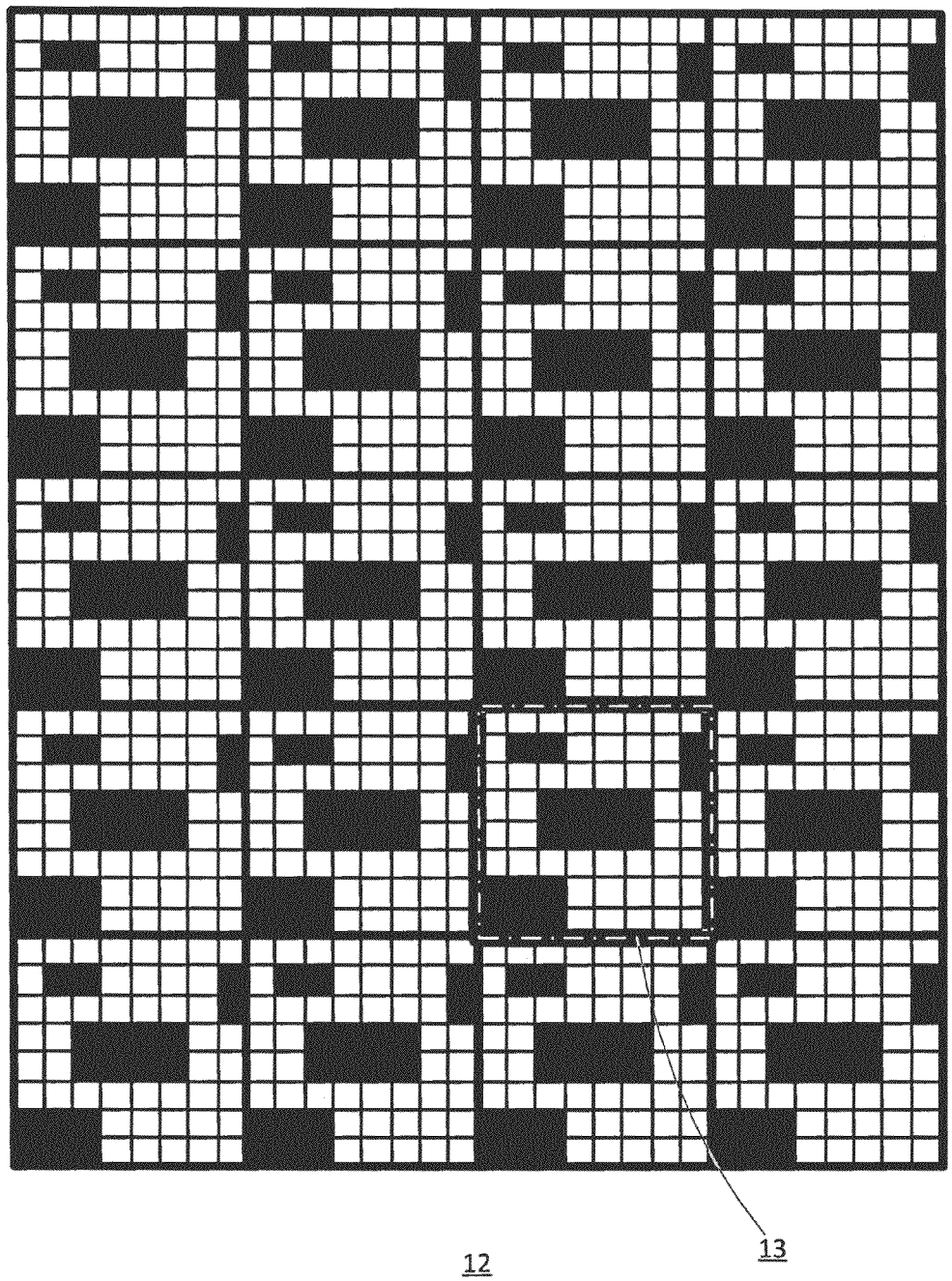
FIG. 2 illustrates a portion of an inspection image of an electric circuit which is repetitive in nature.

Referring to the example of FIG. 2, it is noted that the analyzed pixel is selected from a selected cell, and the reference pixels belong to other cells. Some possible alternatives by which the reference cells (which include the reference pixels) may be selected are discussed below. It is noted that the cells are areas which are substantially similar to each other. Such areas may be part of different parts of the electronic circuit (e.g. memory portions). It is noted that the cells to which the selected and reference pixels belong are not necessarily adjacent to each other. That is, there may be areas of the inspection image between the cells which do not belong to any cell. This may occur, for example, in Core-to-Core inspection.

Referring to an implementation in which the inspected object is a semiconductor substrate (e.g. a wafer or a part thereof), a photomask, or an electronic circuit, it is noted that a microfabricated structure of the inspected object may include multiple cells (e.g. DRAM or SRAM cells). The cells are different regions in which the same pattern is substantially repeated. While not necessarily so, the unit regions (each including a single copy of the repeated pattern) may be of a rectangular shape. An example of dimensions of a unit region is several tens to several hundred nanometer (nm), and also micrometers (microns, μm). Optionally, the size of the repeating cell may also be indicated as a spatial frequency, (e.g. as a number of cells per micron). The structure of the inspected object may include both regions in which an array of cells is repeated regularly, and other non-repetitive regions in which features do not repeat regularly. In other implementations, reference areas may be selected from other groups of similar areas—for example, from different dies, and even from different wafers.

It is noted that it is assumed that a single reference pixel is selected from each reference area (and that analyzed pixel does not belong in any of the reference areas). Since pixels of the reference areas would normally correspond to inspected areas of the inspected object which are substantially of the same size as an area to which the analyzed pixel corresponds, having a single reference pixel selected from each reference area may be easily achieved if the one or more inspection images that include the analyzed pixel and the reference pixels are interpolated (resampled) so that the pixel-size of each cell is an integer. This option is discussed with respect to optional stage 506, which is illustrated in FIG. 6. Alternatively, the reference value of one or more of the reference pixels may be computed from several pixels in the corresponding reference area. In order to simply the discussion, it is assumed below that the size of each cell is $L_x$ by $L_y$ pixels, wherein $L_x$ and $L_y$ are integers. If this is not so, equivalents may be easily derived by a person who is of skill in the art. The defining of the reference areas (e.g. cells) may be obtained via interface 202, by processing of the inspection image, and so on.

The analyzed pixel itself may be selected in various ways out of the inspection image. In some implementations, all pixels of the inspection image (or at least of one or more continuous areas of which) are inspected for defects, and therefore each pixel is selected as the analyzed pixel at different times.

In another implementation, only some of the pixels (one or more) are inspected for defects, and are therefore selected as the analyzed pixel. Selection of only some of the pixels as the analyzed pixel (in different iterations of method 500) may be based on a preliminary list of potential defects which indicates preliminary potentially defective pixels. Such a list may be complied based on an analysis of the inspection image and possibly also on design data (such as computer aided design—CAD—data) and/or a reference image.

The reference pixels may also be selected in various ways. While not necessarily so, each reference pixel is located with respect to the cell in which it is included in the same location as of the analyzed pixel with respect to its cell. For example, for an analyzed pixel located in location (20,13) with respect to its cell, the reference pixels would be located in location (20,13) with respect to their respective cells. In such implementations, the selection of reference pixels is substantially equivalent to a selection of reference cells.

Method 500 may include optional stage 506 of selecting the reference pixels, which is further discussed with respect to FIG. 6. The selecting of the reference pixels (or equivalently of the reference cells) may be conducted either prior to the scanning of at least part of the wafer (e.g. based on CAD data), and may also be conducted as a result of such a scanning.

The number of reference pixels selected (which may be, as aforementioned, equal to the number of other cells from which reference pixels are selected) may be the same for all the pixels in the cell when they are analyzed (or even for all the pixels in the scanned image data), but this is not necessarily so. The number of reference pixels selected for the analyzed pixel is represented by M. As mentioned above, while M may be the same for each pixel, in other implementations different numbers $M_{pixel.ID}$ may be used for different pixels.

Step 520 of method 500 includes calculating for each of the reference pixels a difference between the reference value of the reference pixel and the inspected value. Referring to the examples set forth with respect to the previous drawings, stage 520 may be carried out by a differences analysis module such as differences analysis module 230. Each of the differences calculated in stage 520 is also referred to as a "reference difference".

The calculated difference may be a result of subtraction of the inspected value from the respective reference value (or vice versa), the absolute value of such subtraction, a result of a function which is based on either of those results (e.g. the rounding up of the absolute value), or another function. Any of the above suggested values may pertain to either scalar values (e.g. gray-level or intensity) or to vector values (e.g. an (R,G,B) color triplet). While the calculated difference may be a numerical difference (e.g. a result of subtraction), it may also be of another type (such as a classification e.g. [small, medium, large], an indication of relative intensity e.g. [higher/lower], etc.)

Stage 530 of method 500 includes computing a representative difference value based on a plurality of the differences. While the representative difference value may be computed based on all of the differences (calculated for all of the reference pixels), in other implementations the calculating may be based only on some these differences. The plurality of differences which are referred to in the context of stage 530 are those which are taken into account in the computing of stage 530, and not necessarily all of the differences calculated beforehand.

Referring to the examples set forth with respect to the previous drawings, stage 530 may be carried out by a differences analysis module such as differences analysis module 230. The representative difference value may be considered as associated with the analyzed pixel, and may be stored in a database in an entry associated with the analyzed pixel.

The representative difference value may be calculated in many ways, some of which are discussed in detail below. As is also discussed below, the defect detection for the analyzed pixel in stage 550 (which includes determining a presence of a defect in the analyzed pixel) is based on the representative difference value computed for the analyzed pixel. While in some prior art techniques, the difference between the color values of an analyzed pixel and that of a corresponding pixel which serves as reference is the basis for the defect detection, the defect detection of stage 550 is based on a process which takes into account multiple reference differences.

For example, the representative difference value may be an average of some or all of the reference differences (wherein different types of averages may be implemented, e.g. arithmetic mean, median, geometric median, geometric mean, harmonic mean, quadratic mean, weighted mean, truncated mean, interquartile mean, midrange, winsorized mean, and so forth), but this is not necessarily so.

It is noted that equivalent to selecting a representative difference value for each of the pixels in an analyzed area is generating an image, in which the value assigned to each of the pixels is the representative difference value determined for it.

As aforementioned, the calculating may be based only on some of the differences calculated in stage 520. Furthermore, the actual value of the representative difference value may be responsive only to some of the plurality of differences (even though the computing is based on other differences of the plurality as well). This may be implemented, for example, by executing stages 531 and 532.

Stage 531 includes selecting a proper subset of the plurality of differences, based on all of the plurality of differences. That is, stage 531 includes selecting a proper subset of the plurality of differences, based on the plurality of calculated differences between the inspected value of the analyzed pixel and the reference value of the respective reference pixel. Referring to the examples set forth with respect to the previous drawings, stage 531 may be carried out by a differences analysis module such as differences analysis module 230.

It is noted that set A is a subset of set B if it is "contained" inside B (i.e. all elements of set A are elements of set B). Properly speaking, a subset of set B may coincide with this set. The relationship of one set being a subset of another is called inclusion or sometimes containment. It is noted that in the context of the present discussion, a set may also be referred to as a group, and a subset may also be referred to as a subgroup.

Set A is a proper subset (also referred to as a strict subset) of set B if it is a subset of set B, but is not equal thereto (i.e. there exists at least one element of B not contained in A). This is written as $A \subsetneq B$.

It should be noted that while the selecting of stage 531 may be based on several additional parameters, it takes into account the differences themselves. Some examples for selecting the proper subset out of the plurality of differences based on all of the plurality of differences are provided below (e.g. implementing an order filter). Additional parameters may be for example a distance of the reference pixels for which the respective differences are calculated from the analyzed pixel.

The proper subset may be selected by implementing a selection rule which is defined based on characteristics of the inspection and on requirements of the defect detection system. For example, the selection rule may be defined in a set-up stage (before stage 510 is executed). The selection rule may be defined, for example, based on the type of the inspection (bright field, bark field, SEM, etc.), on the type of the inspected article, on the type of defects sought, and so on.

Stage 532 includes defining the representative difference value based on the proper subset of differences (also referred to as the subset of selected differences). That is, in implementations of method 500 in which stage 532 is executed, the representative difference value is defined based only on calculated differences that belong to the proper subset of differences, and irrespectively of the nonempty subset of excluded differences which includes the other differences of the plurality of differences (even though those excluded differences were taken into account in stage 531 of selecting the proper subset of differences).

The defining of stage 532 may include different kinds of functions whose parameters are the selected differences (and possibly other parameters which exclude the excluded differences). For example, the defining of stage 532 may include defining the representative difference value to be an average of the selected differences. An example of defining which further includes additional parameters is defining the representative difference value to be a weighted average of the selected differences, wherein the weight given to each of the selected differences depends on a distance from the analyzed pixel of the reference pixel corresponding to that selected difference.

Figure 5:
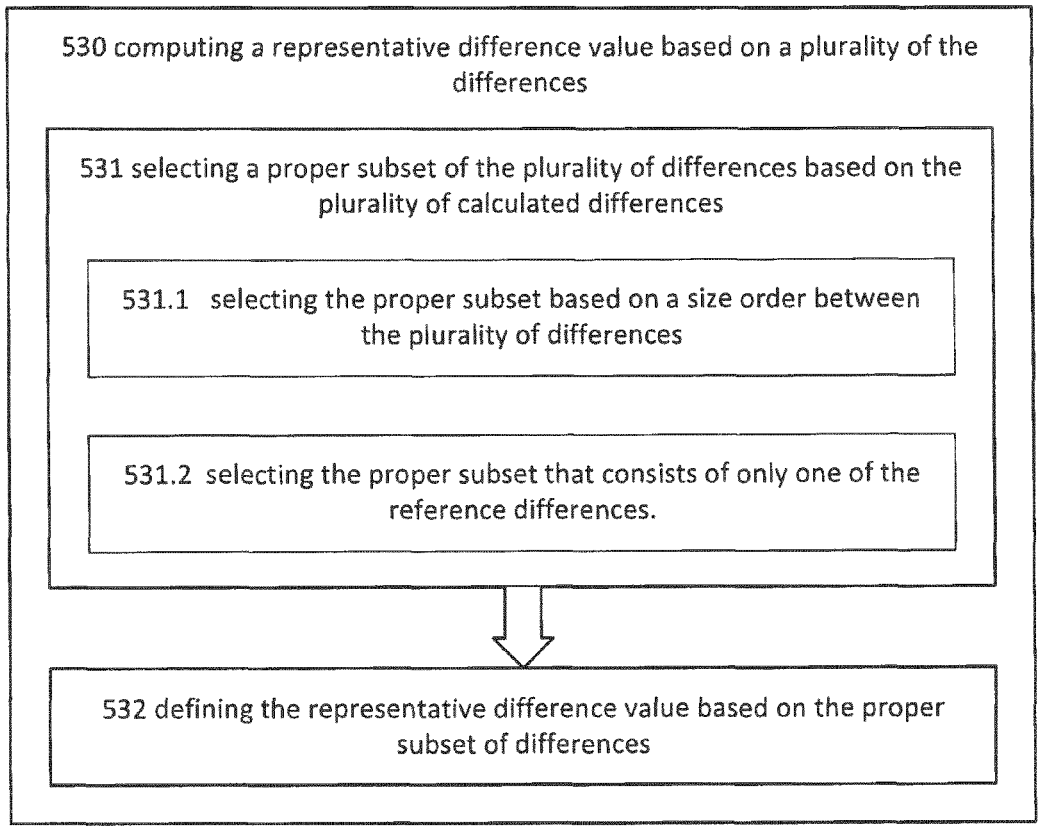
FIG. 5 illustrates variations of a stage of the method of FIG. 4.

Optional variations of the selecting of stage 531 are illustrated in FIG. 5. For example, stage 531 may include stage 531.1 of selecting the proper subset based on a size order between the plurality of differences. This may include, for example, excluding the smallest and the largest differences, selecting N differences equally distributed around an average of the plurality of differences, and so on (in all the examples, N and, where applicable, also d are assumed to be positive integer numbers).

The determining of the presence of a defect in the analyzed pixel (i.e. determining whether there is or there is not a presence of a defect in the analyzed pixel) in stage 550 is based on the representative difference value. While not necessarily so, the larger the representative difference value, the greater the likelihood that a presence of a defect would be determined in stage 550.

Optionally, the computing of stage 530 may include selecting one of the plurality of differences as the representative difference value, or at least computing the representative difference value based on a single selected reference value (i.e. selecting the proper subset which consists of only one difference, e.g. selecting only the one nearest the median difference). Selecting one of the differences as the representative difference may enable reduction of costs. For example, the computational costs for selecting one of the reference differences as the representative difference value (or using a function which ignores all of the other reference differences) may be significantly lower than defining the representative difference value based on multiple reference differences. Stage 531 may include stage 531.2 of selecting the proper subset that consists of only one of the reference differences. The selecting of one of the plurality of differences (either as directly the representative difference value or as the proper subset) may include selecting it between a plurality of differences including at least three differences, at least six differences, and so on.

According to an embodiment of the invention, the computing of the representative difference may include selecting of one of the reference differences, without any modification or alteration thereto.

In order to detect possible defects, a decision which is based on the determined representative difference value is taken (e.g. whether the analyzed pixel should be classified as having a possible defect, which may require further review—for example by another system, at a higher inspection level, by a human reviewer, or any combination thereof). Such a decision may include determining a presence of a defect in the pixel (or not so), based on a comparison of the representative difference value to a threshold level. Such a threshold level may be different for different analyzed pixels, and may be based for example on a noise level associated with the analyzed pixel (e.g. based on a noise indicative value—such as variance).

When an object is inspected to provide an image thereof (e.g. thereby providing the inspected image data), different parts of the object are imaged with different levels of noise. For example, when electronic circuits (e.g. a wafer) are imaged—parts of the electronic circuit which are made from different materials may be imaged with different noise levels. This may happen in different types of imaging techniques (e.g. electron beam scanning, optical scanning), and for different types of imaged objects and materials.

Clearly, pixels of the image that are imaged in a lower noise level may provide more exact results, wherein more minute defects may be detected (e.g. in a defect detection inspection of a wafer). Therefore, pixels may be typed according to their noise levels. One of the possible parameters which may be used for the classification (also referred to as "segmentation") of pixels is variance (VAR), which is the different between the color value (e.g. gray level value) of the brightest pixel in an area surrounding that pixel (e.g. a 5×5 pixels kernel area, centered around the pixel) to the color value (e.g. gray level) of the darkest pixel in that area. Clearly, other parameters indicating noise may be used.

Stage 550 may optionally be preceded by stage 540 (illustrated, for example, in FIG. 6) which includes defining a noise-indicative value for the analyzed pixel. Referring to the examples set forth with respect to the previous drawings, stage 540 may be carried out by a processor such as processor 220, optionally by a dedicated sub module thereof.

Stage 540 may include defining the noise-indicative value (of a noise-indicative attribute) for the analyzed pixel based on information of other pixels. Some of those other pixels may be pixels in the immediate environment of the analyzed pixel (such as the pixels of the kernel discussed above), and optionally some of the pixels may be one or more of the reference pixels and/or pixels in the immediate environments of those reference pixels.

Optionally, stage 540 may include stage 541 of classifying the analyzed pixel into one out of multiple noise-indicative classes, possibly based on the noise-indicative value assigned to the analyzed pixel and/or to one or more of the reference pixels (e.g. in response to an average of the variance values defined for the analyzed pixel and for one or more of the plurality of reference pixels).

Some of the possible variations by which the noise-indicative value may be determined for the analyzed pixel are detailed with respect to stage 620 of method 600. Any of these variations may be incorporated into method 500 (and especially as part of stage 540), mutatis mutandis.

According to an embodiment of the invention (e.g. if stage 620 is incorporated as part of stage 540), the determining of the presence of the defect in the analyzed pixel may be based on the representative difference value and on a representative noise-indicative value that is computed based on a plurality of noise-indicative values which includes a noise-indicative value and multiple reference noise-indicative values, the inspected noise-indicative value representative of an analyzed pixel and each of the reference noise-indicative values representative of a reference pixel.

Stage 550 of method 500 includes determining a presence of a defect in the analyzed pixel based on the representative difference value (and possibly on other parameters associated with the analyzed pixel as well—such as the noise-indicative value). For example, the determining of the presence of the defect may be based on a comparison of the representative difference value computed for the analyzed pixel to a threshold level (which is based on the noise-indicative value defined in stage 540). Referring to the examples set forth with respect to the previous drawings, stage 550 may be carried out by a defect analysis module such as defect analysis module 240.

It is noted that the determining of the presence of a defect in the analyzed pixel may be a binary determination (i.e. present or non-present, defective or non-defective, and so on), but this is not necessarily so. Optionally, the determining of the presence of a defect in the analyzed pixel may use a defect-indicative classification system which has more than two classes (i.e. more than just the classes of "having a possible defect" and "not having a possible defect").

As discussed in greater detail with respect to stage 620 of method 600 (which, as aforementioned, may be incorporated into stage 540, mutatis mutandis), a representative noise-indicative value may be computed for the analyzed pixel, based on information of a group of reference pixels (a group which may include some, none, or all of the plurality of reference pixels, and possibly also other reference pixels).

If a representative noise-indicative value is determined for the analyzed pixel based on the reference noise-indicative value of the reference pixels (and is possibly later used for segmenting the analyzed pixel into one out of two or more noise-based classes), then stage 550 may include determining the presence of a defect in the analyzed pixel based on the representative difference value and on the representative noise-indicative value (or a derived parameter such as threshold determined selected or otherwise determined based on the representative noise-indicative value). For example, stage 550 may include determining the presence of a defect in the analyzed pixel based on a comparison of the representative difference value and a threshold level determined based on information of M reference pixels (this is also referred to as M-sided segmentation).

As aforementioned, the representative difference value (on which the defect detection is based) may be selected so that the determining of the presence of the defect in the analyzed pixel would be executed under the assumption that one or more of the reference pixels (e.g. pixel P) may be defective. That is, while the reference pixels (and possibly likewise the reference cells) are taken as reference by which defects are sought after—method 500 may perform even under the assumption that neither of those reference pixels (and/or those reference cells) is non-defective (e.g. using the above indicated implementations). Generally, the determining of the presence of the defect in the analyzed pixel may be based on a computation which is based on the multiple reference values which are representative of the reference pixels, wherein the reference pixels may include defective pixels.

Stage 550 may be followed by optional stage 560 of providing defect detection results which are based on a result of the determination of stage 550. The defect detection results may be provided in various ways (e.g. using a display, a communication interface, and so forth), and to one or more targets (e.g. to a human, to another system, and so forth). Referring to the examples set forth with respect to the previous drawings, stage 560 may be carried out by a defect analysis module such as defect analysis module 240.

Stage 550 may be followed by a stage of reporting one or more defects, if multiple analyzed pixels are processed in multiple iterations of the preceding stages (e.g. as part of the results provided in stage 560). The reporting may include reporting location information of at least one of the defects (and possibly of all of them) in pixel coordinates, in coordinates of the inspected object, in coordinates of a corresponding design data, etc.

The results provided may further include additional information identifying one or more defects which were identified within the inspection image, such as one or more of the following (e.g. as a part of a defect list):
Location information of one or more defective pixels);
Size information, indicating size of the defects;
Type information, identifying initial classification of the defect;
Small image excerpts of the inspection image, each of which includes one or more defective pixels;
Grade of the item in one or more grading systems (e.g. indication of the likelihood of defectiveness of the indicated potential defect).

Method 500 may further include optional stage 570 of selectively applying one or more industrial processes in response to a result of the determination of the presence of the defect. Clearly, in different embodiments of the invention, different industrial processes may be applied. For example, stage 570 may include applying any combination of one or more of the following industrial processes:
A production industrial process (e.g. further examining the inspected object, discarding the inspected object and/or another item, selecting a process which the inspected object needs to undergo, defect detection using inspection or review tools, which may be for example photon or electron beam based imaging systems, etc.);
A chemical industrial process (e.g. applying to the inspected object a chemical material whose concentration is selected and/or manipulated based on the results of stage 550, etc.);
A mechanical industrial process (e.g. applying mechanical force onto the inspected object, etc.);
An information technology industrial process (e.g. writing information to a database and/or tangible storage, modifying communication routing channel, encrypting, etc.);

Method 500 may also continue with other actions that are based on the determined presence of the defect. For example, stage 570 may include selectively scanning areas of the inspected object in a resolution higher than the resolution of the inspection image, based on a result of stage 550. In such a case, the areas selected for further scanning may be selected based on the locations of potential defects which are classified into certain classes but not into at least one of the other classes. Referring to the examples set forth in the previous drawings, such inspection may be carried out by an inspection machine such as inspection machine 210, or by a posterior inspection module (which may be another inspection machine), such as posterior inspection module 280. For example, if the inspected object is indeed a wafer, the inspection image may be obtained using Electron Beam Inspection (EBI) in a first resolution, while the potential defects selected, based on the way in which they were classified, may be further inspected in much higher resolution by a Defect Review Scanning Electron Microscope (DRSEM).

Stage 570 may also include declaring the wafer (or specific dies thereof) as operational or non-operational based on the results of stage 550 and/or the results of stage 570 (e.g. the high resolution inspection).

Inspecting only potential defects which for which a presence of a defect was determined in stage 550, while not inspecting other potential defects (e.g. received in a preliminary defects lists prior to stage 520) saves time and resources, and may also improve the results of the inspection. For example, scanning less areas of the wafer would lead to less accumulation of electrical charge resulting from the electrons beamed by the electron beam scanning apparatus.

FIG. 6 is a flow chart of computerized method 500 for computerized detection of defects in an inspected object, according to an embodiment of the invention. The stages which are illustrated in FIG. 6 but not in FIG. 4 are optional, and the different possible combinations of those stages and of stages 510, 520, 530, 540, and 550 may be implemented in different embodiments of the invention.

Method 500 may include stage 502 of scanning an area of the inspected object (e.g. the wafer) to provide scanned image data. The scanning of the scanned area may be a part of larger parts of the wafer—e.g. a die, multiple dies, or even the entire wafer (or at least the parts of which that include electronic circuit parts). The scanning may be carried out using different techniques such as electron beam scanning and optical scanning. Referring to the examples set forth in the previous drawings, stage 502 may be carried out by any scanning, imaging and/or detecting apparatus such as inspection machine 210.

An implementation of the scanning of stage 502 for scanning a wafer may include, for example, the following sub-steps: (a) illuminating an inspected die; (b) receiving detection signals by at least one detector; (c) processing the detection signals to provide an image of a portion of the illuminated die, the image including a grid of pixels, each characterized by a signal such as a gray level signal; and optionally (d) selecting which pixel out of the grid of pixels to currently process, said pixel being the analyzed pixel. The selection may follow a predefined pattern, such as a raster scan pattern, but other selection schemes may be implemented.

Since the scanning may be a lengthy process, some or all of the other stages (e.g. any one or more of stages 510 through 570) may be carried out at least partly concurrently with the scanning of one or more parts of the inspected object, such as the scanning of the scanned area of the inspected object in stage 502. Alternatively, stage 502 may entirely precede stage 510, and possibly other stages of method 500 (e.g. stages 520, 530, 550, 560). The scanned image data (or part thereof) may be processed in order to determine the inspected value and the reference values obtained in stage 510. The scanned image data and/or the inspected value and the reference value may be stored in a database which is stored in a tangible memory, whether volatile (e.g. DRAM, SRAM) and/or non-volatile (e.g. Hard-drive, Flash memory).

Method 500 may further include additional stages that precede the optional scanning of the scanned area in stage 502, such as wafer alignment and translation of the wafer so that the reference area may be scanned. The global alignment of the wafer (e.g. by aligning a stage on which the wafer is positioned) may be based, for example, on CAD data, using coarse anchor points from the design data. For example, coarse registration on a single large target by the Applied Materials patented RGA algorithm may be implemented. The translation of the wafer may include translating the wafer to a position in which the reference die may be scanned. Alignment methods are known in the art. An illustration of a method for such an alignment is described in U.S. Pat. Nos. 5,699,447, 5,982,921 and 6,178,257B1 of Alumot. Another alignment method is described at U.S. Pat. No. 5,659,172 of Wagner.

The information required for successful execution of such preliminary stages may be retrieved from a previously determined recipe (or recipe parameters) and/or from a configuration file (referred to as "config") which does not pertain to a specific scan or to a specific layer of a wafer, but rather to a configuration of the scanning machine executed right after its manufacture (or at a later time, irrespective of any specific target to be scanned).

As aforementioned, method 500 may include stage 504 of resampling at least a part of the scanned image data, so that in each reference cell a single pixel will correspond to the analyzed pixel. This may include resampling the at least one part of the scanned image data, so that in each reference cell a single pixel will correspond to any pixel selected in the selected cell (and possibly—in any one of the possible selected cells).

Optionally, the scanned image may be interpolated so that the repeating cells would be of integer dimensions. While in the example of FIG. 7 the dimensions of each of the cells is exactly 8×8 pixels, in real time scanning the cell size may be of a fractural size (e.g. 7.655 by 8.3191 pixels). The pixel size of each cell depends not only on the physical size of the repeating portion of the pattern but also on parameters of the scanning (e.g. enlargement factor, distance between the wafer and the scanner, and so forth). If the cells are of fractural size, interpolating the image data so that it would include cells of integer size may be carried out in order to enable further computation. While in the disclosure following it would be assumed that each of the pixels belongs to exactly one cell, and that each pixel has a reference pixel exactly corresponding to it in each cell (and not a combination of parts of several pixels), implementing the techniques disclosed for cells of fractural sizes or any non-integer sizes may be achieved with modifications that will straightforwardly present themselves to a person having ordinary skill in the art after being presented with the herein disclosed invention, and will therefore not be discussed here in further detail.

As aforementioned, method 500 may include optional stage 506 of selecting the reference pixels for the analyzed pixel (assuming the analyzed pixel is previously selected). While stage 506 is illustrated as following the scanning of stage 502 and preceding the obtaining of the inspected and reference values, this is not necessarily so. The selecting of the reference pixels (or equivalently of the reference cells) may also be conducted prior to the scanning of at least part of the inspected object (e.g. based on CAD data), as a result of such a scanning.

Possibly, the cells may be predefined cells (e.g. which are defined in the recipe or in the configuration file). However, optionally method 500 may include analyzing the inspection image data (of one or more inspection images) to define the cells (e.g. by searching for repeating patterns). Optionally, method 500 may include analyzing design data (e.g. CAD data) to define the cells (e.g. by searching for a repeating pattern). In any of these cases, cells are defined prior to the selection of the reference pixels, and stage 506 may include selecting the plurality of reference pixels out of at least one inspection image, based on reference cells predefined in the at least one image.

As aforementioned, while not necessarily so, the reference pixels may be located in equivalent locations with respect to the cells in which they are included as of the analyzed pixel with respect to its cell. In some implementations (such as though not limited to the equivalent locations implementation), the selection of reference pixels is substantially equivalent to a selection of reference cells, and therefore the selecting of reference pixels with respect to FIG. 7 is exemplified using the equivalent of selecting the reference cells.

Figure 7:
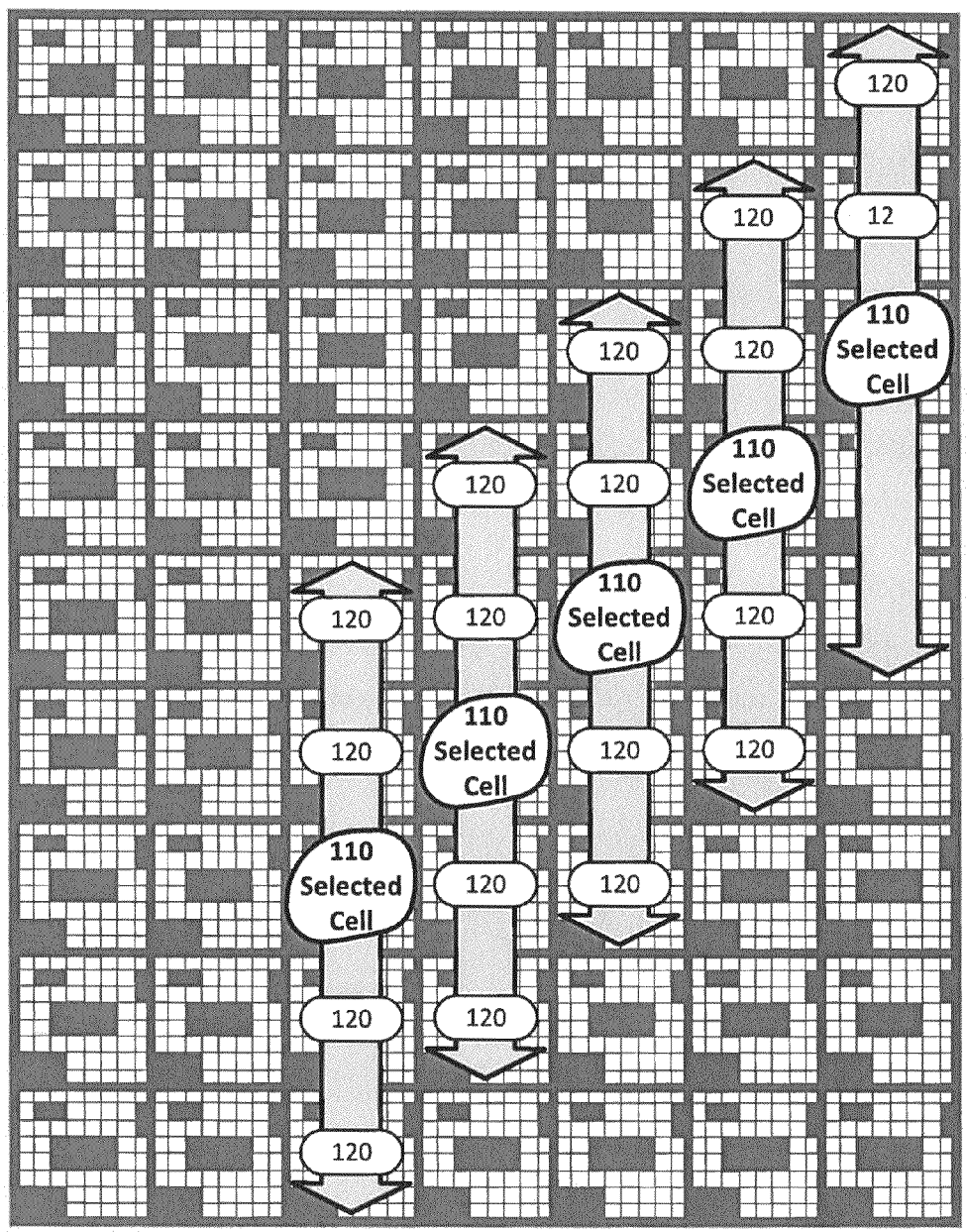
FIG. 7 illustrates selection of reference pixels for each analyzed pixel, according to an embodiment of the invention.

FIG. 7 illustrates selection of reference pixels (represented by reference cells) for each analyzed pixel (represented by a selected cell), according to an embodiment of the invention. In the illustrated example, the cells are arranged in a square lattice. However, this is not necessarily so, and the cells may also be arranged in another lattice arrangement (e.g. a rhombic lattice, a hexagonal lattice, a rectangular lattice, a parallelogrammic lattice, etc.), or even in a non-lattice arrangement. However, for simplicity of explanation, the following discussion is provided in the context of a parallelogrammic lattice (wherein if the lattice is a parallelogrammic lattice that is not a rectangular lattice, the axis denoted as X and Y should refer to the axes of symmetry of the lattice).

In the illustrated example, the reference cells for each analyzed pixel are selected from the same column as the selected cell. The selected cell in each column of the illustration is denoted 110, and the corresponding reference cells are denoted as 120. It is noted that more than one pixel in each column may be selected as an analyzed pixel, but for the sake of illustration simplicity, this is not illustrated.

In the given example, four reference pixels are selected for each of the analyzed pixels (i.e. M=4 for all analyzed pixels). Other values of M may be selected. If M is an even number (e.g. M=4 as in the example), the reference cells selected may be divided evenly on both sides of the analyzed cell (the cell which includes the analyzed pixel).

In cells which are relatively close to the edge of the repeating pattern (represented by the stitch), a smaller number of reference pixels may be selected, or selection in a different pattern may be implemented. For example, the illustrated selection technique may be implemented (in which for analyzed cells whose distance to the edge is smaller than M/2, all of the cells between them and the edge are selected as reference cells, and other cells are selected on the other side of the analyzed cell are selected to complete a group of M reference cells).

In the illustrated example, all of the reference cells are selected from the same column. However, selection of reference cells of the same row may also be implemented; a combination of them may be implemented (e.g. selection of reference cells arranged in a cross pattern whose center is the analyzed cell); and selection of cells outside the row and column of the analyzed cell may also be implemented (e.g. selection of reference cells arranged in a square whose center is the analyzed cell, or reference cells which are arranged diagonally). It is further noted that the reference cells (from which the reference pixels are selected) are not necessarily adjacent to the selected cell or to each other.

For example, stage 506 may include analyzing the inspection image data searching for the cell most resembling the selected cell (whether out of predefined cells or in a process which includes searching for similar cells). The resemblance sought may also be resemblance of part of the cell (e.g. of a kernel surrounding the analyzed pixel). The resemblance may be average resemblance (e.g. Minimum Least Square Error, MLSE), but this is not necessarily so.

Referring to method 500 generally, it is noted that since method 500 is a computerized method, a program of instructions may be implemented, which, when executed by one or more processors, results in the execution of one of the aforementioned variations of method 500.

It would be clear to a person who is of skill in the art that instructions may be included in the program of instructions for executing some or all of the stages of method 500 (in all possible combinations suggested above), even if the inclusion of such instructions has not been explicitly elaborated.

Figure 8:
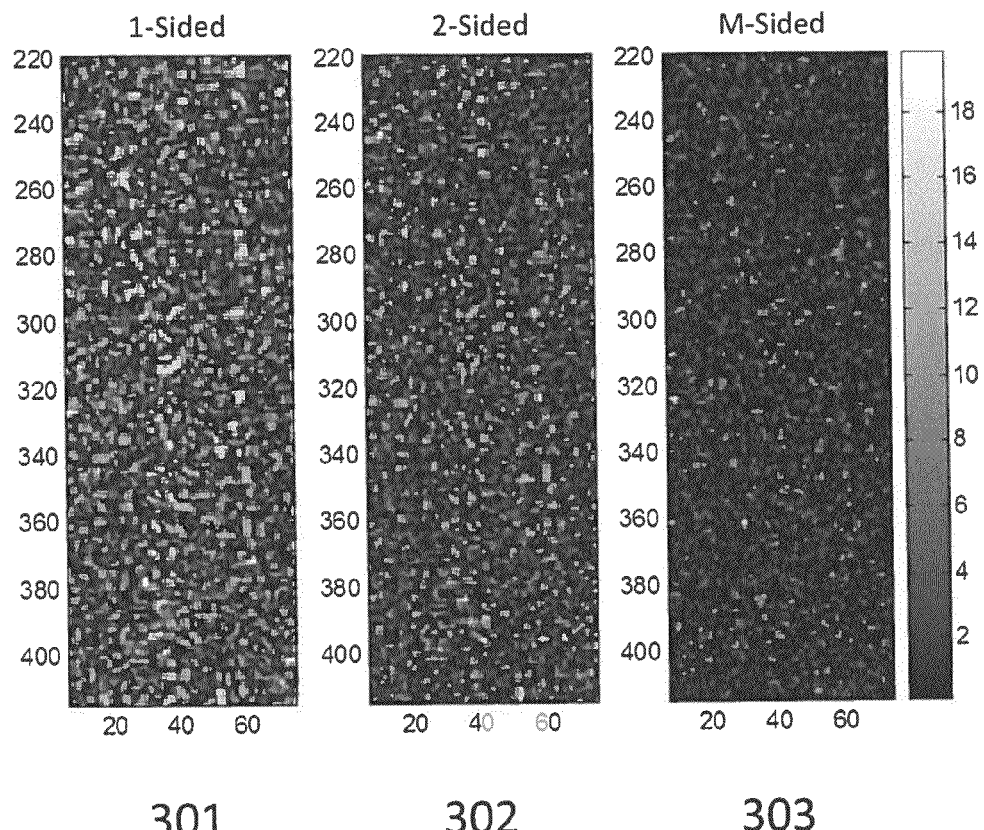
FIG. 8 illustrates a comparison of difference images, according to an embodiment of the invention.

FIG. 8 illustrates a comparison of difference images 301, 302 and 303, according to an embodiment of the invention, in which the representative difference value which is determined for each of the pixels is used as its color value (grey level in this case) in the respective difference image.

As can be seen, the number of bright pixels (indicative of high difference) when using two reference cells ("2-sided", in image 302) instead of the one used in prior art cell-to-cell comparison ("1-sided", in image 301) is greatly reduced, and is further reduced when using a higher number of reference cells ("M-sided", for some exemplary larger M, in image 303). Therefore, the number of possible defects which should be further inspected is greatly reduced, possibly diminishing a great deal of false alarm cases.

Reverting to FIG. 3, further possible components and features of system 200 which may be implemented (in all possible combinations thereof) in different implementations of system 200 are provided below. Following the discussion of method 500, many details of the following components and features will become clearer to the reader.

Referring to differences analysis module 230, it may optionally be configured to compute the representative difference value by: (a) selecting a proper subset of the plurality of differences based on the plurality of calculated differences between the inspected value of the analyzed pixel and the reference value of the respective reference pixel, and (b) defining the representative difference value based on the proper subset of differences.

The differences analysis module may be configured to select the proper subset according to a selection rule which is defined based on characteristics of the inspection and on requirements of the defect detection system, e.g. as discussed above.

Differences analysis module 230 may also be configured to select the proper subset based on a size order between the plurality of differences.

Regarding defect analysis module 240, it may optionally be configured to determine the presence of the defect in the analyzed pixel by executing a computation which is based on the multiple reference values which are representative of the reference pixels, wherein the reference pixels may include defective pixels.

Defect analysis module 240 may also be configured to determine the presence of the defect in the analyzed pixel based on the representative difference value and on a representative noise-indicative value that is computed based on a plurality of noise-indicative values which comprises a noise-indicative value and multiple reference noise-indicative values, the inspected noise-indicative value representative of an analyzed pixel and each of the reference noise-indicative values representative of a reference pixel.

Regarding processor 220, it may be further configured to select the plurality of reference pixels out of at least one inspection image, based on reference cells predefined in the at least one image.

As aforementioned, system 200 may further include a sensor (e.g. inspection machine 210 or part thereof) that is configured to inspect an inspection object and to provide the inspection image based on the inspection.

Figure 9:
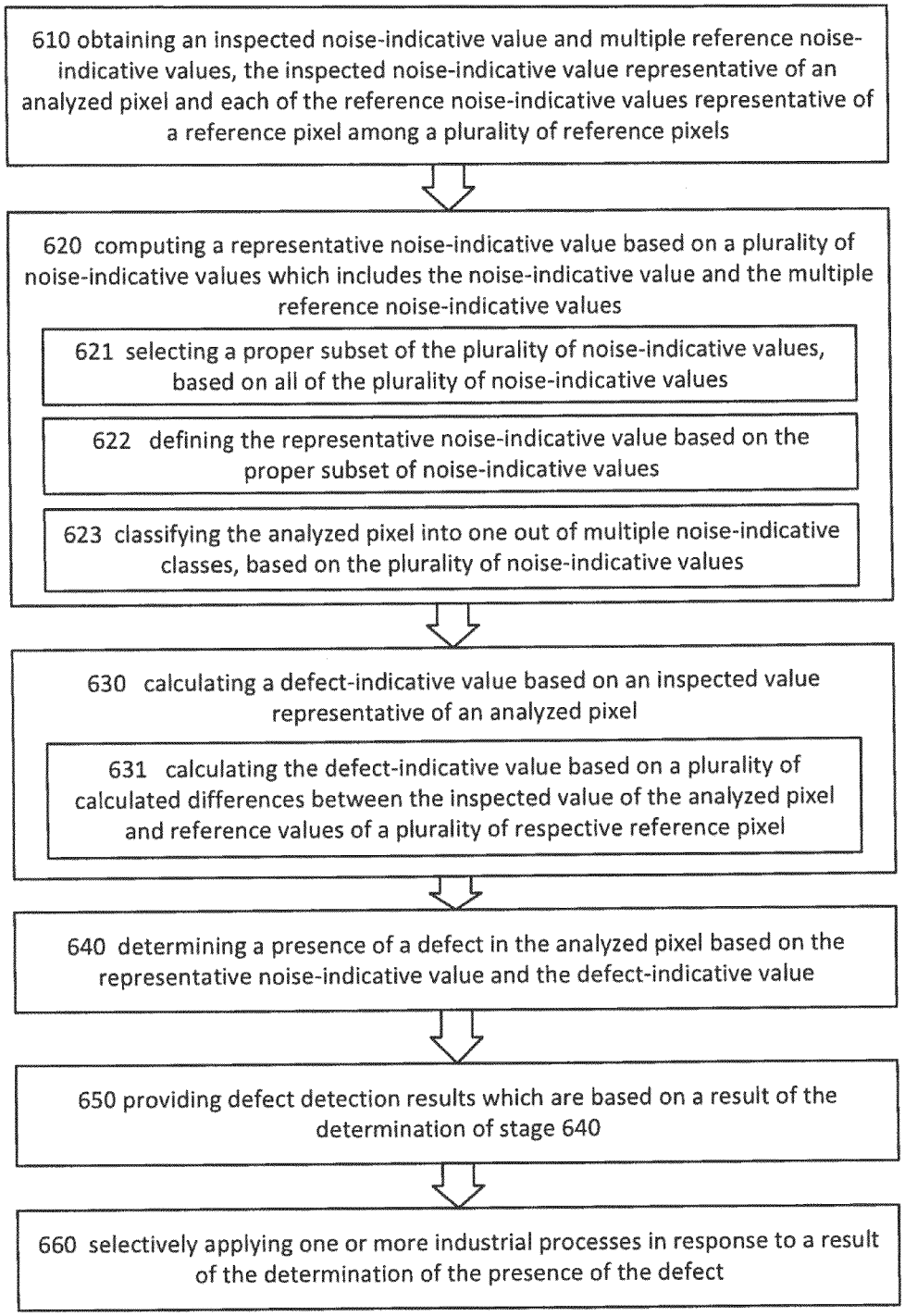
FIG. 9 is a flow chart of a computerized method for computerized detection of defects in an inspected object, according to an embodiment of the invention.

FIG. 9 is a flow chart of computerized method 600 for computerized detection of defects in an inspected object, according to an embodiment of the invention. Referring to the examples set forth in the following drawings, method 600 may be carried out by system 300. Different embodiments of system 300 may implement the various disclosed variations of method 600 even if not explicitly elaborated. Likewise, different embodiments of method 600 may include stages whose execution fulfills the various disclosed variations of system 300, even if succinctness and clarity of description did not necessitate such repetition. Like method 500, method 600 may also be implemented for various types of inspected objects, from a very minute scale to larger objects.

In order to clarify the disclosure, different stages of method 600 will be exemplified using an example of an inspected object which is selected from a group consisting of an electronic circuit, a wafer, and a photomask (a partially transparent plate which may be used for the manufacturing of electronic circuits or other objects in a process implementing transmitting light through such a photomask, such as photolithography). It is noted that while method 600 is described as a method for detecting defects (or at least potential defects) in the inspection object, a person who is of ordinary skill in the art would understand that method 600, like method 500, may equivalently be implemented for detection of many other types of items within various types of inspection images.

Stage 610 of method 600 includes obtaining an inspected noise-indicative value and multiple reference noise-indicative values. Referring to the examples set forth with respect to the following drawings, stage 610 may be carried out by an inspection result interface such as the inspection results the interface of system 300.

The inspected noise-indicative value is representative of an analyzed pixel and each of the reference noise-indicative values is representative of a reference pixel among a plurality of reference pixels. It is noted that many of the terms which were used in the description of method 500 also apply to the description of method 600, and therefore the explanation of which is not necessarily repeated. For example, like in method 500, the analyzed pixel is a pixel of an inspection image in which at least a part of the inspected object is imaged (e.g. an inspection image of a wafer). Likewise, similarly to method 500 the reference pixels may be pixels of the same inspection image, and may also be pixels of other images (e.g. an inspection image of another area of the inspected object or an inspection image of a reference object similar to the inspected object). Wherever applicable, terms which are used in the description of method 600 may have similar meaning to the ones used in the discussion of method 500, even if not explicitly repeated.

The obtained noise-indicative values are values of one or more noise-indicative attributes. As mentioned above, pixels of an inspection image that are imaged in a lower noise level may provide more exact results, as more minute defects may be detected (e.g. in a defect detection inspection of a wafer). Therefore, pixels may be assigned a value of a noise-indicative attribute, which is indicative of their noise level (whether real or estimated).

As aforementioned, one of the possible noise-indicative attributes which may be used is variance, which is the difference between the color value (e.g. gray level value) of the brightest pixel in an area surrounding that pixel (e.g. a 5×5 pixels kernel area, centered around the pixel) to the color value (e.g. gray level) of the darkest pixel in that area. Clearly, other parameters indicating noise may be used. For example, if the color attribute of each pixel is not a scalar, the noise-indicative attribute may be responsive to multiple color values of each of the analyzed pixels and their neighboring pixels. In another example, pattern based noise indicative values may be implemented, meaning that following an applying of a pattern detection process to the respective images, different pattern types shall be used as noise indications.

It is noted that the obtaining of stage 610 may be implemented in different ways in different implementations of the invention. For example, the obtaining may include obtaining only information of the analyzed pixel and the reference pixels, but may also include obtaining information of images to which those pixels belong.

Furthermore, the obtaining may include obtaining such information from an external system (e.g. from an external inspection unit, external camera or detector, and so on), and/or obtaining such information by capturing (or otherwise generating) the aforementioned pixel information, or the larger part of the inspection image. Method 600 may include a stage of capturing the image information (e.g. as part of a scanning of the inspected object).

It is noted that like in method 500, optionally, each of the analyzed pixel and the multiple reference pixels is a pixel of an inspected image of the inspected object. In other implementations, some or all of the reference pixels may be pixels of an inspected image of another inspected object (e.g. a similar wafer).

Stage 620 of method 600 includes computing a representative noise-indicative value based on a plurality of noise-indicative values which includes the noise-indicative value and the multiple reference noise-indicative values. While the representative noise-indicative value may be computed based on all of the obtained noise-indicative values (of the analyzed pixel and of the reference pixels), in other implementations the calculating may be based only on some of these. The plurality of noise-indicative values which are referred to in the context of stage 620 are those which are taken into account in the computing of stage 620, and not necessarily all of the noise-indicative values previously obtained. Referring to the examples set forth with respect to the previous drawings, stage 620 may be carried out by a noise analysis module such as noise analysis module 330. The representative noise-indicative value may be considered as associated with the analyzed pixel, and may be stored in a database in an entry associated with the analyzed pixel.

The representative noise-indicative value may be calculated in many ways, some of which are discussed in detail below. As is also discussed below, the defect detection for the analyzed pixel in stage 640 (which includes determining a presence of a defect in the analyzed pixel) is based on the representative noise-indicative value computed for the analyzed pixel. While in some prior art techniques, the noise-indicative value of an analyzed pixel is the basis for the defect detection, the defect detection of stage 640 is based on a process which takes into account multiple noise-indicative values of multiple pixels. For example, the representative noise-indicative value may be an average of some or all of the reference noise-indicative values, but this is not necessarily so.

It is noted that equivalent to selecting a representative noise-indicative value for each of the pixels in an analyzed area is generating an image, in which the value assigned to each of the pixels is the representative noise-indicative value determined for it.

As aforementioned, the calculating may be based only on some of the noise-indicative values obtained in stage 610. Furthermore, the actual value of the representative noise-indicative value may be responsive only to some of the plurality of noise-indicative values (even though the computing is based on other noise-indicative values of the plurality as well). This may be implemented, for example, by executing stages 621 and 622.

Stage 621 includes selecting a proper subset of the plurality of noise-indicative values, based on all of the plurality of noise-indicative values (with the possible exception, in some implementations, of the inspected noise-indicative value). Referring to the examples set forth with respect to the previous drawings, stage 621 may be carried out by a noise analysis module such as noise analysis module 330.

The proper subset may be selected according to a selection rule which is defined based on characteristics of the inspection and on requirements of the defect detection system, e.g. as discussed above with respect to stage 531 of method 500.

It should be noted that while the selecting of stage 621 may be based on several additional parameters, it takes into account the noise-indicative values themselves. Some examples for selecting the proper subset out of the plurality of noise-indicative values based on all of the plurality of noise-indicative values are provided below (e.g. implementing an order filter). Additional parameters may be for example a distance of the reference pixels for which the respective noise-indicative values are obtained from the analyzed pixel.

Stage 622 includes defining the representative noise-indicative value based on the proper subset of noise-indicative values (also referred to as the subset of selected noise-indicative values). That is, in implementations of method 600 in which stage 622 is executed, the representative noise-indicative value is defined based only on obtained noise-indicative values that belong to the proper subset of noise-indicative values, and irrespectively of the nonempty subset of excluded noise-indicative values which includes the other noise-indicative values of the plurality of noise-indicative values (even though those excluded noise-indicative values were taken into account in stage 621 of selecting the proper subset of noise-indicative values).

The defining of stage 622 may include different kinds of functions whose parameters are the selected noise-indicative values (and possibly other parameters which exclude the excluded noise-indicative values). For example, the defining of stage 622 may include defining the representative noise-indicative value to be an average of the selected noise-indicative values. An example of defining which further includes additional parameters is defining the representative noise-indicative value to be a weighted average of the selected noise-indicative values, wherein the weight given to each of the selected noise-indicative values depends on a distance from the analyzed pixel of the reference pixel corresponding to that selected noise-indicative value.

Figure 10:
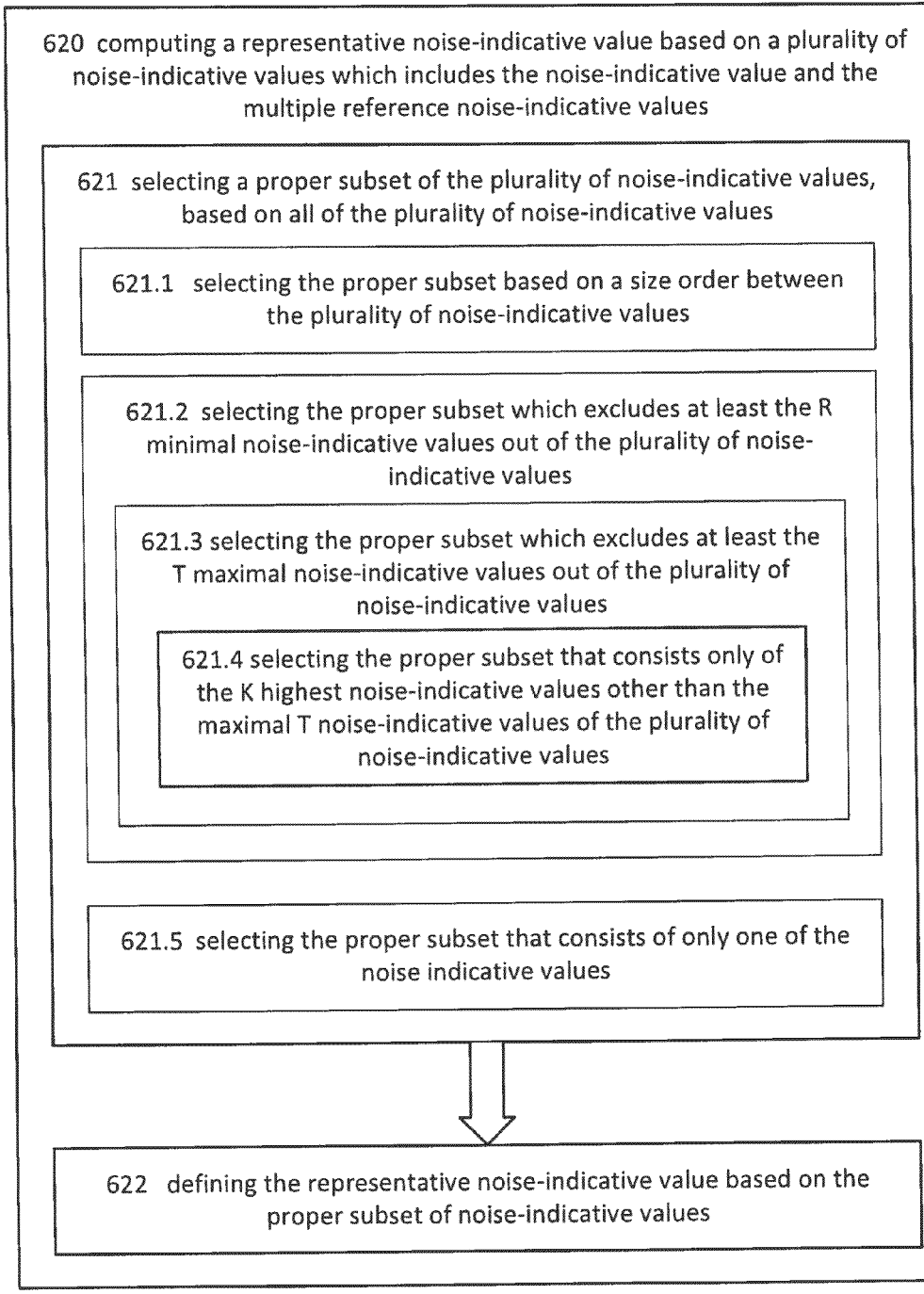
FIG. 10 illustrates variations of a stage of the method of FIG. 9.

Optional variations of the selecting of stage 621 are illustrated in FIG. 10. For example, stage 621 may include stage 621.1 of selecting the proper subset based on a size order between the plurality of noise-indicative values. This may include, for example, selecting the N largest noise-indicative values, selecting the N smallest noise-indicative values, selecting the $(1+d)^{th}$ through the $(N+d)^{th}$ largest (or smallest) noise-indicative values, selecting N noise-indicative values equally distributed around an average of the plurality of noise-indicative values, and so on (in all the examples, N and where applicable also d are assumed to be positive integer numbers).

Stage 621 may include stage 621.2 of selecting the proper subset which excludes at least the R minimal noise-indicative values out of the plurality of noise-indicative values. Any positive integer may be selected for R in different implementations of method 600 (e.g. R may be any of the following: 1, 2, 3, 4, 5, 6, 7, 8, 9, 10, and so on). For example, stage 621.2 may include selecting the proper subset which excludes the minimal noise-indicative value of the plurality of noise-indicative values.

It is noted that in the discussion of method 600, the term maximal noise-indicative value (or higher noise-indicative value) pertains to noise-indicative values which indicate maximal noise-level (or higher noise level, respectively). Likewise, the term minimal noise-indicative value (or lower noise-indicative value) pertains to noise-indicative values which indicate minimal noise-level (or lower noise level, respectively). For example, high variance indicates high noise level, and low variance indicates the opposite.

Optionally, stage 621.2 may also include selecting the proper subset which excludes at least the R minimal noise-indicative values out of the plurality of reference noise-indicative values. That is, as aforementioned, the plurality of noise-indicative values includes not only the multiple reference noise-indicative values but also the noise-indicative value. According to such an implementation of stage 621.2, even if the inspected noise-indicative value is the minimal noise-indicative value of the plurality of noise-indicative values, the proper subset selected would further exclude at least the minimal reference noise-indicative value.

Each of the plurality of noise-indicative values is indicative of the noise-level of pixels which are equivalent to each other in some aspects (equivalency on which the selection of the reference pixels may be based). For example, the plurality of noise-indicative values may be indicative of noise-levels associated with a given location with respect to an imaginary cell.

As aforementioned, different parts of the inspected object are often imaged with different levels of noise. As further stated, pixels of the image that are imaged in a lower noise level may provide more exact results, as more minute defects may be detected. Lower noise-level may be translated to a lower threshold of color difference between a color value of an inspected pixel and a reference color value (e.g. computed based on one or more reference pixels, such as the example of stage 530). Such threshold (or equivalent defect detection criterion) may be determined, however, based on an analysis of a population of pixels classified into the same noise-indicative class for which the threshold is determined.

Classification of noisy pixels as quiet ones would result in a high result of false defects detected, while classification of quiet pixels as noisy ones would lower the accuracy of the detection (as it requires the raising of the threshold required for defect detection in the quieter class) and results in missing of actual defects. Defining the representative noise-indicative value based on a subset which includes the minimal noise-indicative value may result in treating the analyzed pixel as belonging to a quieter noise population than the one it deserves. This may result not only in false detection of a presence of a defect in this pixel (because it is examined against a lower threshold than it deserves) but also in contamination of a quieter population type (corresponding to a quieter noise-indicative class) and setting of an unduly high threshold for the quieter noise-indicative class. Excluding the R minimal noise-indicative values out of the plurality of noise-indicative values may be implemented to overcome those problems.

Stage 621.3, which may be implemented under the conditions of stage 621.2 (though not necessarily so), includes selecting the proper subset which excludes at least the T maximal noise-indicative values out of the plurality of noise-indicative values. Any positive integer may be selected for T in different implementations of method 600 (e.g. R may be any of the following: 1, 2, 3, 4, 5, 6, 7, 8, 9, 10, and so on). For example, stage 621.2 may include selecting the proper subset which excludes the maximal noise-indicative value of the plurality of noise-indicative values (and also excluding the minimal noise-indicative value of the plurality of noise-indicative values, if operating under the conditions of stage 621.2).

If stage 621.3 is implemented, the computing of stage 620 is based on the proper subset which excludes a maximal noise-indicative value out of the plurality of noise-indicative values.

It is noted that is some instances, one or more of the reference pixels may also include defects. Assuming that the plurality of noise-indicative values includes L noise-indicative values, calculated for M reference pixels of L reference cells, the noise-indicative values may be indicated $W_0$ for the inspected noise-indicative value, and $W_1$ through $W_L$ for the reference noise-indicative values of the corresponding reference cells $C_1$ through $C_L$. It is noted that if stage 620 is integrated into method 500 (mutatis mutandis) or if stage 530 is integrated into method 600 (mutatis mutandis), L may be either equal to M or different therefrom. Even if the two are equal (and naturally if not), the groups of reference pixels used in each of these stages may differ from each other.

If one of the reference pixels (e.g. pixel P) is defective (i.e. there is a defect in the inspected object in a location corresponding to that pixel), its reference noise-indicative value $W_i$ is supposed to be significantly higher than that of a non-defective pixel in any similar locations in the cells $C_0 \ldots C_{i-1}$ and $C_{i+1} \ldots C_L$. For example, if the noise-indicative attribute is variance, a defective pixel is likely to have a gray level value which is significantly different than that of its environment, which results in high variance.

The determining of the presence of a defect in the analyzed pixel (i.e. determining whether there is or there is not a presence of a defect in the analyzed pixel) in stage 640 is based on the representative noise-indicative value. While not necessarily so, the larger the representative noise-indicative value, the less likely it is that a presence of a defect would be determined in stage 640.

Not only that a positive correlation may exist between the magnitudes of the selected noise-indicative values and that of the representative noise-indicative value (e.g. as is the case if the representative noise-indicative value is an average of the selected noise-indicative values), positive correlations may exist between the magnitudes of any one of the selected noise-indicative values to the magnitude of the representative noise-indicative value (again, as is the case in the example in which the representative noise-indicative value is an average of the selected noise-indicative values).

Therefore, including a noise-indicative value which is calculated based on the reference value of a defective pixel $P_i$ may decrease the likelihood of detecting a presence of a defect in the analyzed pixel $P_0$ in situations in which the analyzed pixel $P_0$ is defective.

The number T of maximal noise-indicative values excluded from the proper subset of selected noise-indicative values may be determined based on various considerations. For example, it may depend on an acceptable rate of defects (or in other words, assuming that a recurring deviation from a norm may be acceptable if it is more common than a predefined threshold).

Stage 621 may include stage 621.4 of selecting the proper subset that consists only of the K highest noise-indicative values other than the maximal T noise-indicative values of the plurality of noise-indicative values. For example, if K is equal to 1 and T is equal to 1 then stage 621.4 includes selecting the proper subset that consists only of the second noisiest noise-indicative value of the plurality of noise-indicative values. If K is equal to 1 and $1<T<L-1$, then stage 621.4 includes selecting the proper subset that consists only of the $(T-1)^{th}$ noisiest noise-indicative value of the plurality of noise-indicative values. Any positive integer may be selected for K in different implementations of method 600 (e.g. K may be any of the following: 1, 2, 3, 4, 5, 6, 7, 8, 9, 10, and so on).

If stage 621.4 is implemented, then the computing of stage 620 is based on the proper subset which consists only of the K highest noise-indicative values other than the maximal T noise-indicative values of the plurality of noise-indicative values (e.g. only the second noisiest noise-indicative value of the plurality). If stage 621.4 is implemented under the condition of stage 621.2, than $K+T<L$ (and the proper subset excludes the minimal noise-indicative value of the plurality as well). Essentially, under those conditions there are at least three noise-indicative values in the plurality of noise-indicative values on which the computing (and hence the defect detection) is based (i.e. $3 \leq L$, because $1 \leq K$ and $1 \leq T$).

It is noted that is some instances, one or more of the reference pixels may also include defects. K may be determined based on various considerations. For example, it may depend on an acceptable rate of defects (or in other words, assuming that a recurring deviation from a norm may be acceptable if it is more common than a predefined threshold).

Considering both proposed conditions (excluding the maximal T noise-indicative values while selecting the following K), implementation of one or both of them may enable determining the presence of a defect in the analyzed pixel while ignoring any deviation from a norm whose recurrence in a group of pixels consisting of the analyzed pixel and a plurality of reference pixels (those which correspond to the plurality of noise-indicative values) is lower than an acceptable rate. This may enable, for example, deviations which result from manufacturing processes, from inspection processes, and the like, and which do not mount to a defect. Ignoring such deviations further enables, among other results, saving costs which result from processing the analyzed pixel as a defective pixel (e.g. costs resulting from discarding the wafer, from inspecting the corresponding area of the wafer in costly high-resolution inspection machines, from slowing down the manufacturing line, and so on).

Optionally, the computing of stage 620 may include selecting one of the plurality of noise-indicative values as the representative noise-indicative value, or at least computing the representative noise-indicative value based on a single selected reference value (i.e. selecting the proper subset which consists of only one noise-indicative value, e.g. in the example above of selecting only the second noisiest noise-indicative value).

Selecting one of the noise-indicative values as the representative noise-indicative value may enable reduction of costs. For example, the computational costs for selecting one of the reference noise-indicative values as the representative noise-indicative value (or using a function which ignores all of the other reference noise-indicative values) may be significantly lower than defining the representative noise-indicative value based on multiple noise-indicative values.

Stage 621 may include stage 621.5 of selecting the proper subset that consists of only one of the reference noise-indicative values. The selecting of one of the plurality of noise-indicative values (either as directly the representative noise-indicative value or as the proper subset) may include selecting it between a plurality of noise-indicative values including at least three noise-indicative values, at least six noise-indicative values, and so on.

According to an embodiment of the invention, the computing of the representative noise-indicative value may include selecting of one of the reference noise-indicative values, without any modification or alteration thereto.

Many ways of selection of representative noise-indicative value may be implemented. For example—the determining of the representative noise-indicative value may include selecting one of the following values, or basing the determination on one or more of the following values:

The largest noise-indicative value out of all of the plurality of noise-indicative values for that analyzed pixel.

The $N_{th}$ largest noise-indicative value (N being a natural number).

The minimal noise-indicative value out of all of the plurality of noise-indicative values for that analyzed pixel.

The $N_{th}$ smallest noise-indicative value (N being a natural number).

The average or the median of all reference noise-indicative values or the reference noise-indicative value which is closest to the average or the median of all reference noise-indicative values.

The average noise-indicative value based on weights that are assigned to each of the reference noise-indicative values (e.g. the weights may be proportional to the distance of the respective reference cell from the analyzed cell). After implementing the weights, any of the above options (e.g. maximum/average/minimum) may be used—or any other way.

A combination of these options may also be implemented.

Reverting to FIG. 9, stage 620 may further include stage 623 of classifying the analyzed pixel into one out of multiple noise-indicative classes, based on the plurality of noise-indicative values. For example, the classifying of stage 623 may be based on the result of stage 622. Optionally, the noise-indicative class to which the analyzed pixel is classified based on the plurality of noise-indicative values may serve as the representative noise-indicative value.

Method 600 further includes stage 630 of calculating a defect-indicative value based on an inspected value representative of an analyzed pixel. Referring to the examples set forth with respect to the previous drawings, stage 630 may be carried out by a defect analysis module such as defect analysis module 340.

Possibly, the calculating of stage 630 is also based not only on the inspected value but also on at least one reference value that is representative of a reference pixel (and possibly on a plurality of these). For example, the defect-indicative value may be calculated as the difference between the inspected value and the reference value of a reference pixel in a reference cell.

If the calculating of stage 630 is based on the inspected value and on multiple reference values, it may be implemented as stage 631 of calculating the defect-indicative value based on a plurality of calculated differences between the inspected value of the analyzed pixel and reference values of a plurality of respective reference pixels.

It is noted that stage 630 (and especially if implemented as stage 631) may be implemented as an equivalent of stage 530 of method 500. Therefore, stage 530 may be incorporated into method 600 (e.g. as part of stage 630, which may further include incorporation of one or more stages preceding stage 530, such as stage 510 and 520). All of the discussed variations of any of these stages (and especially of stage 530) may be incorporated as part of method 600 (e.g. as part of stage 630).

Like in the discussion of method 500, the inspected value (and likewise the reference values, in the following discussion) may be simply a color-value of the respective pixel, or a color-based attribute which is based on the color-value, but this is not necessarily so. In a gray-level (GL) image, the inspected value may be the one-dimensional color value of the respective pixel. In a color image, the inspected value may be a one-dimensional color value in one out of multiple color channels (e.g. Red, Green, or Blue, in an RGB image), an intensity value, a color identifier, and so on. While in some implementations the inspected value may be representative of other pixels apart from the analyzed pixel (e.g. an average of the color of the analyzed pixels and of its 8 immediately adjacent pixels), in other implementations the inspected value is representative only of the analyzed pixel and is irrespective of information of other pixels (such as neighboring pixels).

Stage 640 of method 600 includes determining a presence of a defect in the analyzed pixel based on the representative noise-indicative value and the defect-indicative value. For example, the determining of the presence of the defect may be based on a comparison of the defect-indicative value computed for the analyzed pixel (e.g. the representative difference value, if stage 631 is implemented) to a threshold level (which is based on the representative noise-indicative value computed in stage 620). Referring to the examples set forth with respect to the previous drawings, stage 640 may be carried out by a defect analysis module such as defect analysis module 340.

While not necessarily so, stage 640 may be implemented similarly to stage 550 of method 500, and all of the variations and distinctions made in the discussion of stage 550 may be implemented for stage 640, mutatis mutandis, even if not explicitly elaborated.

Stage 640 may be followed by optional stage 650 of providing defect detection results which are based on a result of the determination of stage 550. While not necessarily so, stage 650 may be implemented similarly to stage 560 of method 500, and all of the variations and distinctions made in the discussion of stage 560 may be implemented for stage 650, mutatis mutandis, even if not explicitly elaborated.

Stage 640 may be followed by a stage of reporting one or more defects, if multiple analyzed pixels are processed in multiple iterations of the preceding stages (e.g. as part of the results provided in stage 650). The reporting may include reporting location information of at least one of the defects (and possibly of all of them) in pixel coordinates, in coordinates of the inspected object, in coordinates of a corresponding design data, etc.

The results provided may further include additional information identifying one or more defects which were identified within the inspection image, such as one or more of the following (e.g. as a part of a defect list): (a) Location information of one or more defective pixels); (b) Size information, indicating size of the defects; (c) Type information, identifying initial classification of the defect; (d) Small image excerpts of the inspection image, each of which includes one or more defective pixels; (e) Grade of the item in one or more grading systems (e.g. indication of the likelihood of defectiveness of the indicated potential defect), etc.

Method 600 may further include optional stage 660 of selectively applying one or more industrial processes in response to a result of the determination of the presence of the defect. Clearly, in different embodiments of the invention, different industrial processes may be applied. While not necessarily so, stage 660 may be implemented similarly to stage 570 of method 500, and all of the variations and distinctions made in the discussion of stage 570 may be implemented for stage 660, mutatis mutandis, even if not explicitly elaborated. For example, stage 660 may include applying any combination of one or more of the following industrial processes:

A production industrial process (e.g. further examining the inspected object, discarding the inspected object and/or another item, selecting a process which the inspected object needs to undergo, etc.);

A chemical industrial process (e.g. applying to the inspected object an chemical material whose concentration is selected and/or manipulated based on the results of stage 550, etc.);

A mechanical industrial process (e.g. applying mechanical force onto the inspected object, etc.);

An information technology industrial process (e.g. writing information to a database and/or tangible storage, modifying communication routing channel, encrypting, etc.);

Method 600 may also continue with other actions that are based on the determined presence of the defect. For example, stage 660 may include selectively scanning areas of the inspected object in a resolution higher than the resolution of the inspection image, based on a result of stage 640. In such a case, the areas selected for further scanning may be selected based on the locations of potential defects which are classified into certain classes but not into at least one of the other classes. Referring to the examples set forth in the previous drawings, such inspection may be carried out by an inspection machine such as inspection machine 310, or by a posterior inspection module (which may be another inspection machine), such as posterior inspection module 380. For example, if the inspected object is indeed a wafer, the inspection image may be obtained using Electron Beam Inspection (EBI) in a first resolution, while the potential defects selected, based on the way in which they were classified, may be further inspected in much higher resolution by a Defect Review Scanning Electron Microscope (DRSEM).

Stage 660 may also include declaring the wafer (or specific dies thereof) as operational or non-operational based on the results of stage 640 and/or the results of stage 660 (e.g. the high resolution inspection).

Inspecting only potential defects for which a presence of a defect was determined in stage 640, while not inspecting other potential defects (e.g. received in a preliminary defects lists prior to stage 610) saves time and resources, and may also improve results of the inspection. For example, scanning less areas of the wafer would lead to less accumulation of electrical charge resulting from the electrons beamed by the electron beam scanning apparatus.

As aforementioned, the representative noise-indicative value (on which the defect detection is based) may be selected so that the determining of the presence of the defect in the analyzed pixel would be executed under the assumption that one or more of the reference pixels (e.g. pixel Pi) may be defective. That is, while the reference pixels (and possibly likewise the reference cells) are taken as reference by which defects are sought after—method 600 may perform even under the assumption that neither of these reference pixels (and/or those reference cells) is non-defective (e.g. using the above indicated implementations). Generally, the determining of the presence of the defect in the analyzed pixel may be based on a computation which is based on the multiple noise-indicative values which are representative of the reference pixels, wherein one of the reference pixels may be a defective pixel.

Referring to stages 502, 504 and 506 discussed with respect to FIG. 6, it is noted that any of those stages may be incorporated, mutatis mutandis, to method 600. Such equivalent stages may be implemented similarly to the corresponding one or more of stages 502, 504 and 506, and all of the variations and distinctions made in the discussion of stage 502, 504 and 506 may be implemented, mutatis mutandis, as parts of method 600 even if not explicitly elaborated (either preceding stage 610 or not).

Especially, method 600 may include a stage equivalent to stage 506 which may include, according to one of the variations discussed above, selecting the plurality of reference pixels out of at least one inspection image, based on reference cells predefined in the at least one image.

Referring to method 600 generally, it is noted that since method 600 is a computerized method, a program of instructions may be implemented, which, when executed by one or more processors, results in the execution of one of the aforementioned variations of method 500.

It would be clear to a person who is of skill in the art that instructions may be included in the program of instructions for executing some or all of the stages of method 600 (in all possible combinations suggested above), even if the inclusion of such instructions has not been explicitly elaborated.

Figure 11:
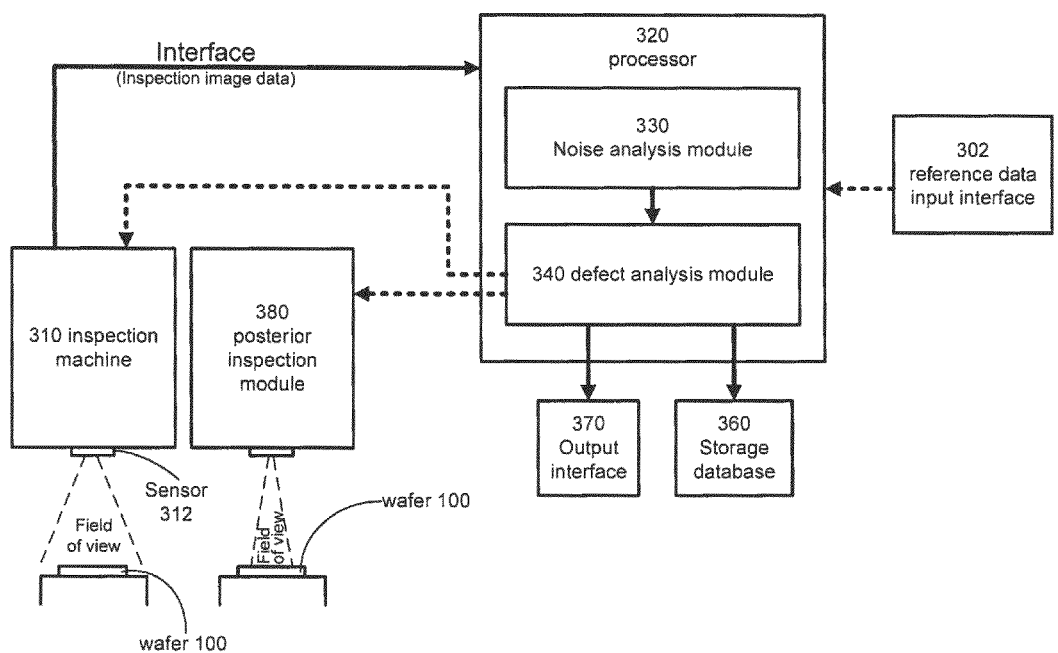
FIG. 11 is a block diagram of a defect detection system, according to an embodiment of the invention.

FIG. 11 is a block diagram of defect detection system 300, according to an embodiment of the invention. System 300 may be used for detection of defects (or other types of identified items) within an inspection image of an inspected object (herein exemplified by wafer 100. As will be clear to a person who is of skill in the art, later references to a "wafer" may be implemented for other types of inspected objects, mutatis mutandis). While not necessarily so, the inspected object may be selected from a group consisting of an electronic circuit, a wafer, and a photomask. It should be noted that, as will be clear to any person who is of skill in the art, wherever the term "wafer" is used—similar techniques, systems, methods and computer program products may be implemented for optical masks that are used for the manufacturing of wafers.

System 300 may obtain the inspection image in many ways. For example, system 300 may be combined with an inspection machine 310 that is used to inspect the wafer (e.g. during different stages of manufacturing thereof). In another implementation system 300 may be connected to such an inspection machine, or the inspection image may be transmitted by an off-line device connected to only one of the machines at a time. Also, system 300 may be an inspection machine into which some or all of the modifications and/or features discussed below have been integrated. For example, system 300 may include sensor 312 that is configured to inspect at least a part of the inspection object, to provide the inspection image. It is noted that inspection machine 310 may be implemented as any of the variations discussed with respect to inspection machine 210.

The plurality of reference pixels may be selected based on a selection rule which is based on (a) in-die periodicity (which may be detected, for example, by processing the inspection image), on (b) design data used for the manufacturing of the inspected object (e.g. CAD date, etc.), (c) on both, and/or on other factors.

Defect detection system 300 may be used for computerized detection of defects in an inspected object based on processing of an inspection image which is generated by collecting signals arriving from the inspected object (the collecting may be executed, for example, by system 310).

System 300 includes an interface for obtaining an inspected noise-indicative value and multiple reference noise-indicative values, the inspected noise-indicative value representative of an analyzed pixel and each of the reference noise-indicative values representative of a reference pixel among a plurality of reference pixels. Examples of ways in which the interface may operate are discussed in further detail in relation to stage 610 of method 600. It is noted that the interface may receive the inspection image data from a component of system 300, or from an external system. The reference pixel may be obtained, for example, from a previous inspection of another die, either from the same wafer or not. It is noted that some of the data (e.g. pertaining to the reference pixels) may be received from systems other than the inspection system 310. For example, reference data pertaining to the reference pixels may be received from a reference data input interface 302 (which may be a part of the interface, but not necessarily so). Interface 302 may be connected, for example, to a tangible storage medium which stores previous inspection information (either processed or preprocessed). It is noted that optionally, each of the analyzed pixel and the multiple reference pixels is a pixel of an inspected image of the inspected object.

System 300 further includes processor 320. While processor 320 may implement software and/or firmware component for its operation, it includes hardware components which enable it to perform the computations and processes for which it is implemented. While not necessarily so, processor 320 may be a dedicated processor whose hardware is designed specifically for the tasks discussed below. Processor 320 includes several modules (at least modules 330 and 340), which may be independent modules, or implemented in an interconnected manner.

Noise analysis module 330 is configured to compute a representative noise-indicative value based on a plurality of noise-indicative values which includes the inspected noise-indicative value and the multiple reference noise-indicative values. Examples of ways in which noise analysis module 330 may operate are discussed in further detail in relation to stage 620 of method 600.

Defect analysis module 340 is configured to calculate a defect-indicative value based on an inspected value representative of the analyzed pixel. It is noted that defect analysis module 340 may be configured to calculate the defect-indicative value further based on an additional parameter, such as (though not limited to) one or more reference values, each of which is representative of a reference pixel. Defect analysis module 340 is further configured to determine a presence of a defect in the analyzed pixel based on the representative noise-indicative value and the defect-indicative value. Examples of ways in which defect analysis module 340 may operate are discussed in further detail in relation to stages 630, 640 and 650 of method 600.

As discussed with respect to system 300, while not necessarily so, the inspected object may be selected from a group consisting of an electronic circuit, a wafer, a photomask, and a reticle.

System 300 may include a tangible storage 360 (e.g. a hard-drive disk, a flash drive, etc.) for storing results of the defect detection process (or part thereof—e.g. only regarding defects which are classified as noteworthy) to a tangible storage. System 300 may also include an output interface 370 for transmitting the results (or part thereof) to an external system (e.g. over cable connection or over wireless connection), wherein that external system may in turn act based on the classification.

System 300 may also include an inspection module, which may be the aforementioned inspection machine 310 which provides the aforementioned inspection image by scanning of the inspected objects such as the wafers, and may alternatively be posterior inspection module 380 that is configured to inspect the wafer (or other inspected object) in higher resolution than that of the inspection image. This inspection module is configured to selectively scan, in a resolution higher than the resolution of the inspection image, areas of the inspected object which are selected based on the locations of identified items (e.g. potential defects) which are classified into certain classes but not into at least one of the other classes (i.e. refraining from selecting potential defects classified into at least one class other than the certain classes). The field of view of posterior inspection module 380 may be narrower than that of inspection machine 310, but this is not necessarily so.

In such a case, the areas selected for further scanning may be selected based on the locations of potential defects which are classified into certain classes but not into at least one of the other classes. For example, the scanning in the higher resolution may be carried out around the locations of the possible defects classified as "short gate", but not around the locations of the possible defects classified as "edge roughness".

It should be noted that inspection machine 310 and/or posterior inspection module 380, if implemented, may be implemented as inspection machines of various types, such as optical imaging machines, electron beam inspection machines, radars, LIDARs and so on.

Generally, identifying defects in a wafer (or in another inspected object) may be implemented using different techniques, among which are optical inspection and electron beam inspection. Utilization of system 300 may facilitate the use of more than a single inspection technique. For example, an initial inspection of the wafer is firstly carried out relatively quickly and in a coarse manner by inspection system 300 (e.g. using an optical inspection or an electron beam inspection set for coarse and fast inspection). Later, some of the potential defects found in the initial inspection are then studied again using a relatively slower but more exact inspection. Such posterior scanning may be executed either in another mode of inspection machine 310, or in a different posterior inspection module 380 (in a process also referred to as "reviewing", e.g. by DRSEM—a Defect Review Scanning Electron Microscope).

As aforementioned, some of the ways in which system 300 and its component may operate are discussed in greater detail with respect to method 500.

System 300 may be implemented on a computer (such as a PC), e.g. the computer which implements the overall classification (Image Based Attributing, IBA) of the runtime inspection results, but this is not necessarily so. Each of the modules or components of system 300 may be implemented in software, hardware, firmware, or any combination thereof. Additionally, system 300 may also include other components that are not illustrated, and whose inclusion will be apparent to a person who is of skill in the art—e.g. a power source, a display, etc.

Further possible components and features of system 300 which may be implemented (in all possible combinations thereof) in different implementations of system 300 are provided below. Following the discussion of method 600, many details of the following components and features would become clearer to the reader.

Optionally, noise analysis module 330 may be configured to compute the representative noise value at least by: (a) selecting a proper subset of the plurality of noise-indicative values which are representative of corresponding pixels of a group comprising the analyzed pixels and the plurality of reference pixels, the subset excluding a minimal noise-indicative value out of the plurality of noise-indicative values; and (b) defining the representative noise-indicative value based on the proper subset of noise-indicative values.

Optionally, noise analysis module 330 may be configured to select the proper subset according to a selection rule which is defined based on characteristics of the inspection and on requirements of the defect detection system, e.g. as discussed above.

Optionally, noise analysis module 330 may be configured to select the proper subset based on a size order between the plurality of noise indicative values.

Optionally, noise analysis module 330 may be configured to compute the representative noise-indicative value based on the proper subset which excludes a maximal noise-indicative value out of the plurality of noise-indicative values.

Optionally, noise analysis module 330 may be configured to compute the representative noise-indicative value based on the proper subset that consists only of the Nth noisiest noise-indicative value of the plurality of noise-indicative values. For example, noise analysis module 330 may be configured to compute the representative noise-indicative value based on the proper subset that consists only of the second noisiest noise-indicative value of the plurality of noise-indicative values.

Optionally, noise analysis module 330 may be configured to compute the representative noise-indicative value by selecting one of the plurality of noise-indicative values as the representative noise-indicative value.

Optionally, defect analysis module 340 may be configured to determine the presence of the defect in the analyzed pixel based on a computation which is based on the multiple noise-indicative values which are representative of the reference pixels, wherein one of the reference pixels may be a defective pixel.

Optionally, processor 320 may be configured to select the plurality of reference pixels out of at least one inspection image, based on reference cells predefined in the at least one image.

Figure 12:
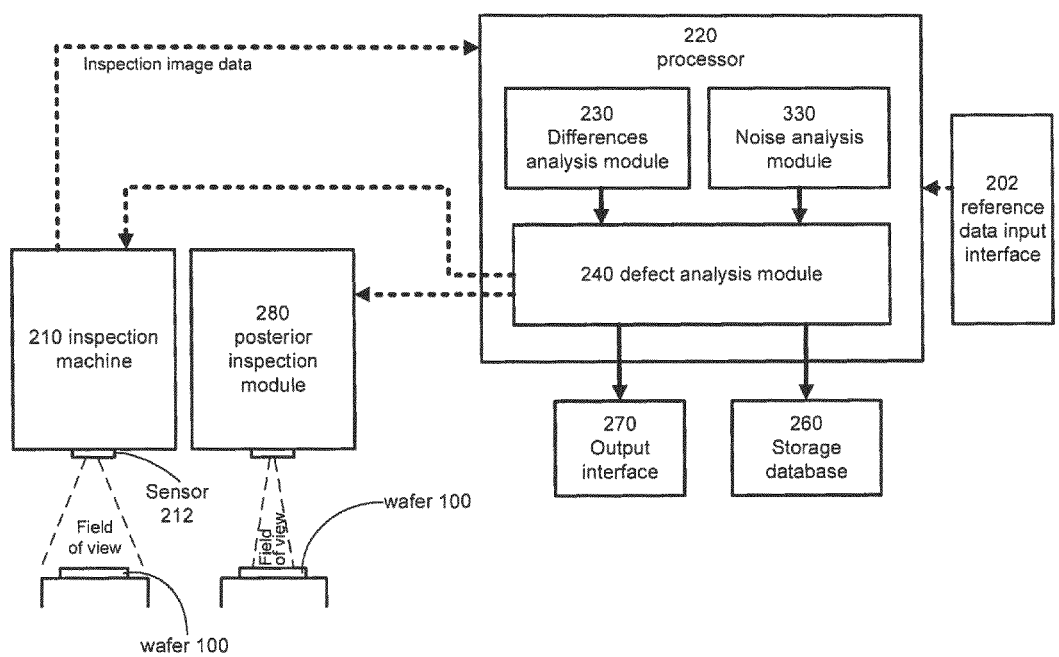
FIG. 12 is a block diagram of a defect detection system, according to an embodiment of the invention.

It is noted that functionalities of systems 200 and 300 may be combined in a single system. FIG. 12 is a block diagram of defect detection system 200, according to an embodiment of the invention. According to the implemented variation, processor 220 further includes noise analysis module 330 (which was discussed with respect to system 300).

Therefore, in the implementation illustrated in FIG. 12, the processor includes:

Differences analysis module 230 which is configured to: calculate differences based on an inspected value representative of the analyzed pixel and on multiple reference values, each of which is representative of a reference pixel among the plurality of reference pixels; wherein the differences analysis module is configured to calculate for each of the reference pixels a difference between the reference value of the reference pixel and the inspected value; and to compute a representative difference value based on a plurality of the differences.

Noise analysis module 330 which is configured to compute a representative noise-indicative value based on a plurality of noise-indicative values which comprises the inspected noise-indicative value and the multiple reference noise-indicative values.

Defect analysis module 230, which is configured to calculate a defect-indicative value based on an inspected value representative of the analyzed pixel (and possibly also on other parameters, such as at least one reference value that is representative of a reference pixel), and to determine a presence of a defect in the analyzed pixel based on at least both of: (a) the representative noise-indicative value and (b) the representative difference value.

It will also be understood that any of systems 200 and 300 according to the invention may be a suitably programmed computer. Likewise, the invention contemplates a computer program being readable by a computer for executing one or both of methods 500 and 600, and any of the above discussed variations thereof. The invention further contemplates a machine-readable memory tangibly embodying a program of instructions executable by the machine for executing the method of the invention.

For example, a computer program product for implementing method 500 may include a program storage device readable by machine may be implemented, tangibly embodying a program of instructions executable by the machine to perform a method for computerized detection of defects in an inspected object based on processing of an inspection image generated by collecting signals arriving from the inspected object, the method including the steps of: (a) obtaining an inspected value representative of an analyzed pixel and multiple reference values, each of which is representative of a reference pixel among a plurality of reference pixels; (b) for each of the reference pixels, calculating a difference between the reference value of the reference pixel and the inspected value; (c) computing a representative difference value based on a plurality of the differences; and (d) determining a presence of a defect in the analyzed pixel based on the representative difference value.

Likewise, a computer program product for implementing method 600 may include a program storage device readable by machine, tangibly embodying a program of instructions executable by the machine to perform a method for computerized detection of defects in an inspected object based on processing of an inspection image generated by collecting signals arriving from the inspected object, the method including the steps of: (a) obtaining an inspected noise-indicative value and multiple reference noise-indicative values, the inspected noise-indicative value representative of an analyzed pixel and each of the reference noise-indicative values representative of a reference pixel among a plurality of reference pixels; (b) computing a representative noise-indicative value based on a plurality of noise-indicative values which includes the noise-indicative value and the multiple reference noise-indicative values; (c) calculating a defect-indicative value based on an inspected value representative of the analyzed pixel; and (d) determining a presence of a defect in the analyzed pixel based on the representative noise-indicative value and the defect-indicative value.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It will be appreciated that the embodiments described above are cited by way of example, and various features thereof and combinations of these features can be varied and modified.

While various embodiments have been shown and described, it will be understood that there is no intent to limit the invention by such disclosure, but rather, it is intended to cover all modifications and alternate constructions falling within the scope of the invention, as defined in the appended claims.

What is claimed is:

1. A defect detection system for computerized detection of defects in an inspected object based on processing of an inspection image of the inspected object, the system comprising:
 a memory; and
 a processor operatively coupled to the memory to:
  identify an analyzed pixel from a first cell of the inspection image of the inspected object;
  identify a plurality of reference pixels from a plurality of cells of the inspection image of the inspected object, the plurality of cells being other cells in the inspection image than the first cell of the inspection image;
  obtain an inspected noise-indicative value representative of the analyzed pixel of the first cell of the inspected image, and a plurality of reference noise-indicative values representative of the plurality of reference pixels from the plurality of cells other than the first cell of the inspection image;
  compute a representative noise-indicative value based on a plurality of noise-indicative values which comprises the inspected noise-indicative value and the plurality of reference noise-indicative values;
  calculate a defect-indicative value based on an inspected value representative of the analyzed pixel; and
  determine a presence of a defect in the analyzed pixel based on the representative noise-indicative value and the defect-indicative value.

2. The system according to claim 1, wherein the inspected object is selected from a group consisting of an electronic circuit, a wafer, a photomask, and a reticle.

3. The system according to claim 1, wherein the plurality of reference pixels are selected based on a selection rule which is based on at least one of: in-die periodicity and or design data used for the manufacturing of the inspected object.

4. The system according to claim 1, wherein the processor is to compute the representative noise value at least by: selecting a proper subset of the plurality of noise-indicative values which are representative of corresponding pixels of a group comprising the analyzed pixel and the plurality of reference pixels, the subset excluding a minimal noise-indicative value out of the plurality of noise-indicative values; and defining the representative noise-indicative value based on the proper subset of noise-indicative values.

5. The system according to claim 4, wherein the processor is to select the proper subset according to a selection rule which is defined based on characteristics of an inspection of the inspected object and on requirements of the defect detection system.

6. The system according to claim 4, wherein the processor is to select the proper subset based on a size order between the plurality of noise indicative values.

7. The system according to claim 4, wherein the processor is to compute the representative noise-indicative value based on the proper subset which excludes a maximal noise-indicative value out of the plurality of noise-indicative values.

8. The system according to claim 1, wherein the processor is to compute the representative noise-indicative value by selecting one of the plurality of noise-indicative values as the representative noise-indicative value.

9. A method for computerized detection of defects in an inspected object based on processing of an inspection image of the inspected object, the method comprising:
    identifying an analyzed pixel from a first cell of the inspection image of the inspected object;
    identifying, by a processor, a plurality of reference pixels from a plurality of cells of the inspection image of the inspected object, the plurality of cells being other cells in the inspection image than the first cell of the inspection image;
    obtaining an inspected noise-indicative value representative of the analyzed pixel of the first cell of the inspected image, and a plurality of reference noise-indicative values representative of the plurality of reference pixels from the plurality of cells other than the first cell of the inspection image;
    computing a representative noise-indicative value based on a plurality of noise-indicative values which comprises the noise-indicative value and the plurality of reference noise-indicative values;
    calculating a defect-indicative value based on an inspected value representative of the analyzed pixel; and
    determining a presence of a defect in the analyzed pixel based on the representative noise-indicative value and the defect-indicative value.

10. The method according to claim 9, wherein the inspected object is selected from a group consisting of an electronic circuit, a wafer, a photomask, and a reticle.

11. The method according to claim 9, wherein the computing comprises: selecting a proper subset of the plurality of noise-indicative values which are representative of corresponding pixels of a group comprising the analyzed pixel and the plurality of reference pixels, the subset excluding a minimal noise-indicative value out of the plurality of noise-indicative values; and (b) defining the representative noise-indicative value based on the proper subset of noise-indicative values.

12. The method according to claim 11, wherein the computing is based on the proper subset which excludes a maximal noise-indicative value out of the plurality of noise-indicative values.

13. The method according to claim 9, wherein the computing comprises selecting one of the plurality of noise-indicative values as the representative noise-indicative value.

14. A program storage device readable by machine, tangibly embodying a program of instructions executable by the machine to perform operations for computerized detection of defects in an inspected object based on processing of an inspection image of the inspected object, comprising:
    identifying an analyzed pixel from a first cell of the inspection image of the inspected object;
    identifying, by the machine, a plurality of reference pixels from a plurality of cells of the inspection image of the inspected object, the plurality of cells being other cells in the inspection image than the first cell of the inspection image;
    obtaining an inspected noise-indicative value representative of the analyzed pixel of the first cell of the inspected image, and a plurality of reference noise-indicative values representative of the plurality of reference pixels from the plurality of cells other than the first cell of the inspection image;
    computing a representative noise-indicative value based on a plurality of noise-indicative values which comprises the noise-indicative value and the plurality of reference noise-indicative values;
    calculating a defect-indicative value based on an inspected value representative of the analyzed pixel; and
    determining a presence of a defect in the analyzed pixel based on the representative noise-indicative value and the defect-indicative value.

15. The program storage device according to claim 14, wherein the inspected object is selected from a group consisting of an electronic circuit, a wafer, a photomask, and a reticle.

16. The program storage device according to claim 14, wherein the computing comprises: selecting a proper subset of the plurality of noise-indicative values which are representative of corresponding pixels of a group comprising the analyzed pixel and the plurality of reference pixels, the subset excluding a minimal noise-indicative value out of the plurality of noise-indicative values; and defining the representative noise-indicative value based on the proper subset of noise-indicative values.

17. The program storage device according to claim 16, wherein the selecting comprises selecting the proper subset based on a size order between the plurality of noise indicative values.

18. The program storage device according to claim 16, wherein the computing is based on the proper subset which excludes a maximal noise-indicative value out of the plurality of noise-indicative values.

19. The program storage device according to claim 16, wherein the computing is based on the proper subset that consists only of the second noisiest noise-indicative value of the plurality of noise-indicative values.

20. The program storage device according to claim 14, wherein the computing comprises selecting one of the plurality of noise-indicative values as the representative noise-indicative value.

* * * * *